(12) United States Patent
Yamazawa et al.

(10) Patent No.: US 8,741,097 B2
(45) Date of Patent: *Jun. 3, 2014

(54) PLASMA PROCESSING APPARATUS AND PLASMA PROCESSING METHOD

(75) Inventors: Yohei Yamazawa, Nirasaki (JP); Chishio Koshimizu, Nirasaki (JP); Masashi Saito, Nirasaki (JP); Kazuki Denpoh, Nirasaki (JP); Jun Yamawaku, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 372 days.

This patent is subject to a terminal disclaimer.

(21) Appl. No.: 12/913,162

(22) Filed: Oct. 27, 2010

(65) Prior Publication Data

US 2011/0094996 A1    Apr. 28, 2011

Related U.S. Application Data

(60) Provisional application No. 61/265,523, filed on Dec. 1, 2009, provisional application No. 61/265,545, filed on Dec. 1, 2009.

(30) Foreign Application Priority Data

Oct. 27, 2009  (JP) ................................. 2009-245988
Oct. 27, 2009  (JP) ................................. 2009-245991
Sep. 27, 2010  (JP) ................................. 2010-215113

(51) Int. Cl.
*H01L 21/306* (2006.01)
*C23C 16/00* (2006.01)

(52) U.S. Cl.
USPC ............. 156/345.48; 118/723 I; 118/723 AN; 315/111.51

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS 5,109,790 A    5/1992  Matsumoto et al.
5,280,154 A    1/1994  Cuomo et al.
(Continued)

FOREIGN PATENT DOCUMENTS

CN    1055495 A    10/1991
CN    1392754 A    1/2003
(Continued)

OTHER PUBLICATIONS

U.S. Office Action mailed Mar. 22, 2013 in co-pending U.S. Appl. No. 12/913,135.

(Continued)

*Primary Examiner* — Luz Alejandro Mulero
(74) *Attorney, Agent, or Firm* — Rothwell, Figg, Ernst & Manbeck, P.C.

(57) ABSTRACT

A plasma processing apparatus includes a processing chamber including a dielectric window; a coil-shaped RF antenna, provided outside the dielectric window; a substrate supporting unit provided in the processing chamber; a processing gas supply unit; an RF power supply unit for supplying an RF power to the RF antenna to generate a plasma of the processing gas by an inductive coupling in the processing chamber, the RF power having an appropriate frequency for RF discharge of the processing gas; a correction coil, provided at a position outside the processing chamber where the correction coil is to be coupled with the RF antenna by an electromagnetic induction, for controlling a plasma density distribution on the substrate in the processing chamber; a switching device provided in a loop of the correction coil; and a switching control unit for on-off controlling the switching device at a desired duty ratio by pulse width modulation.

11 Claims, 18 Drawing Sheets

(56) References Cited

U.S. PATENT DOCUMENTS

| | | | |
|---|---|---|---|
| 5,401,350 A | 3/1995 | Patrick et al. | |
| 5,620,523 A | 4/1997 | Maeda et al. | |
| 5,637,961 A | 6/1997 | Ishii et al. | |
| 5,731,565 A * | 3/1998 | Gates | 219/121.54 |
| 5,800,619 A | 9/1998 | Holland et al. | |
| 5,907,221 A | 5/1999 | Sato et al. | |
| 5,919,382 A | 7/1999 | Qian et al. | |
| 6,016,131 A | 1/2000 | Sato et al. | |
| 6,164,241 A | 12/2000 | Chen et al. | |
| 6,229,264 B1 | 5/2001 | Ni et al. | |
| 6,252,354 B1 * | 6/2001 | Collins et al. | 315/111.51 |
| 6,876,155 B2 * | 4/2005 | Howald et al. | 315/111.51 |
| 2002/0041160 A1 | 4/2002 | Barnes et al. | |
| 2002/189763 A1 | 12/2002 | Kwon et al. | |
| 2003/0111181 A1 | 6/2003 | Wang et al. | |
| 2003/0145952 A1 | 8/2003 | Wilcoxson et al. | |
| 2004/0085246 A1 | 5/2004 | Howald et al. | |
| 2004/0216676 A1 | 11/2004 | Wilcoxson et al. | |
| 2004/0223579 A1 | 11/2004 | Lee et al. | |
| 2005/0205211 A1 * | 9/2005 | Singh et al. | 156/345.48 |
| 2007/0256787 A1 | 11/2007 | Chandrachood et al. | |
| 2008/0185284 A1 | 8/2008 | Chen et al. | |
| 2008/0223521 A1 | 9/2008 | Kim et al. | |

FOREIGN PATENT DOCUMENTS

| | | |
|---|---|---|
| CN | 1537405 A | 10/2004 |
| CN | 1689132 A | 10/2005 |
| CN | 101304630 A | 11/2008 |
| JP | 7-122397 A | 5/1995 |
| JP | 8-162288 A | 6/1996 |
| JP | 2001-52894 A | 2/2001 |
| JP | 2003-517197 A | 5/2003 |
| JP | 2003-273028 A | 9/2003 |
| JP | 2004-537830 A | 12/2004 |
| JP | 2005-534150 | 11/2005 |

OTHER PUBLICATIONS

U.S. Office Action mailed Oct. 17, 2013 in co-pending U.S. Appl. No. 12/913,441 (26 pages).

Office Action mailed Mar. 28, 2014 in co-pending U.S. Appl. No. 12/913,411, filed Oct. 27, 2010.

Office Action mailed Apr. 9, 2014 in co-pending U.S. Appl. No. 12/913,183, filed Oct. 27, 2010.

* cited by examiner

PLASMA PROCESSING APPARATUS AND PLASMA PROCESSING METHOD

CROSS-REFERENCE TO RELATED APPLICATIONS

This application claims priority to Japanese Patent Application Nos. 2009-245988 and 2009-245991 filed on Oct. 27, 2009 and 2010-215113 filed on Sep. 27, 2010 and U.S. Provisional Application Nos. 61/265,545 and 61/265,523 filed on Dec. 1, 2009, the entire contents of which are incorporated herein by reference.

FIELD OF THE INVENTION

The present invention relates to a technique for performing a plasma process on a target substrate to be processed; and, more particularly, to an inductively coupled plasma processing apparatus and a plasma processing method therefor.

BACKGROUND OF THE INVENTION

In the manufacturing process of a semiconductor device or a flat panel display (FPD), a plasma is widely used in a process such as etching, deposit, oxidation, sputtering or the like since it has a good reactivity with a processing gas at a relatively low temperature. In such plasma process, the plasma is mostly generated by a radio frequency (RF) discharge in the megahertz range. Specifically, the plasma generated by the RF discharge is classified into a capacitively coupled plasma and an inductively coupled plasma.

Typically, an inductively coupled plasma processing apparatus includes a processing chamber, at least a portion (e.g., a ceiling portion) of which is formed of a dielectric window; and a coil-shaped RF antenna provided outside the dielectric window, and an RF power is supplied to the RF antenna. The processing chamber serves as a vacuum chamber capable of being depressurized, and a target substrate (e.g., a semiconductor wafer, a glass substrate or the like) to be processed is provided at a central portion of the chamber. Further, a processing gas is introduced into a processing space between the dielectric window and the substrate.

As an RF current flows through the RF antenna, an RF magnetic field is generated around the RF antenna, wherein the magnetic force lines of the RF magnetic field travel through the dielectric window and the processing space. A temporal alteration of the generated RF field causes an electric field to be induced azimuthally. Moreover, electrons azimuthally accelerated by the induced electric field collide with molecules and/or atoms of the processing gas, to thereby ionize the processing gas and generate a plasma in a doughnut shape.

By increasing the size of the processing space in the chamber, the plasma is efficiently diffused in all directions (especially, in the radical direction), thereby making the density of the plasma on the substrate uniform. However, the uniformity of the plasma density on the substrate that is obtained by merely using a typical RF antenna is generally insufficient for the plasma process.

Accordingly, even as for the inductively coupled plasma processing apparatus, it becomes one of the most important factors to improve the uniformity of the plasma density on the substrate and several techniques therefor have been suggested, since it determines the uniformity and the reproducibility of the plasma process itself and, furthermore, the manufacturing production yield.

In a representative conventional technique for improving the uniformity of the plasma density, the RF antenna is divided into a plurality of segments. Such RF antenna dividing method includes a first method for individually supplying RF powers to the respective antenna segments (see, e.g., U.S. Pat. No. 5,401,350); and a second method for controlling the division ratio of the RF powers that are divided from one RF power supply to all the antenna segments by changing each impedance of the antenna segments in an additional circuit such as a capacitor or the like (see, e.g., U.S. Pat. No. 5,907,221).

In addition, there has been known a method in which a single RF antenna is used and a passive antenna is provided around the RF antenna (see, e.g., Japanese Patent Application Publication No. 2005-534150 (JP2005-534150A)). The passive antenna is formed of an independent coil to which an RF power is not supplied from the RF power supply. The passive antenna serves to decrease the intensity of the magnetic field in the loop of the passive antenna compared to that of the magnetic field generated by the RF antenna (inductive antenna) and increase the intensity of the magnetic field outside the loop of the passive antenna. Accordingly, the radial distribution of the RF electromagnetic field in the plasma generating region in the chamber is changed.

SUMMARY OF THE INVENTION

In view of the above, the present invention provides an inductively coupled plasma processing apparatus and a plasma processing method therefor, capable of freely accurately controlling the plasma density distribution by using a simple correction coil without requiring special processing on the plasma-generating RF antenna or the RF power supply system.

In accordance with a first aspect of the present invention, there is provided a plasma processing apparatus including: a processing chamber including a dielectric window; a coil-shaped RF antenna, provided outside the dielectric window; a substrate supporting unit, provided in the processing chamber, for mounting thereon a target substrate to be processed; a processing gas supply unit for supplying a desired processing gas into the processing chamber to perform a desired plasma process on the target substrate; an RF power supply unit for supplying an RF power to the RF antenna to generate a plasma of the processing gas by an inductive coupling in the processing chamber, the RF power having an appropriate frequency for RF discharge of the processing gas; a correction coil, provided at a position outside the processing chamber where the correction coil is to be coupled with the RF antenna by an electromagnetic induction, for controlling a plasma density distribution on the substrate in the processing chamber; a switching device provided in a loop of the correction coil; and a switching control unit for on-off controlling the switching device at a desired duty ratio by pulse width modulation.

With such configuration, especially the configuration having the correction coil, the switching device and the switching control unit, it is possible to stably obtain in a standardized manner the effect of the correction coil on the RF magnetic field generated around the antenna conductor by the RF current flowing in the RF antenna (the effect of locally decreasing the density of the core plasma generated around the position overlapped with the coil conductor by the inductive coupling) when the RF power is supplied from the RF power supply unit to the RF antenna, and also possible to control the effect of the correction coil (the effect of locally decreasing the density of the core plasma) approximately linearly.

Accordingly, the plasma density distribution around the substrate on the substrate supporting unit can be arbitrarily and accurately controlled, and the uniformity of the plasma process can be easily improved.

In accordance with a second aspect of the present invention, there is provided a plasma processing apparatus including: a processing chamber including a dielectric window; a coil-shaped RF antenna, provided outside the dielectric window; a substrate supporting unit, provided in the processing chamber, for mounting thereon a target substrate to be processed; a processing gas supply unit for supplying a desired processing gas into the processing chamber to perform a desired plasma process on the target substrate; an RF power supply unit for supplying an RF power to the RF antenna to generate a plasma of the processing gas by an inductive coupling in the processing chamber, the RF power having an appropriate frequency for RF discharge of the processing gas; a correction coil, provided at a position outside the processing chamber where the correction coil is to be coupled with the RF antenna by an electromagnetic induction, for controlling a plasma density distribution on the substrate in the processing chamber; a variable resistor provided in a loop of the correction coil; and a resistance control unit for controlling a resistance of the variable resistor to a desired value.

With such configuration, especially the configuration having the correction coil, the variable resistor and the resistance control unit, it is possible to stably obtain in a standardized manner the effect of the correction coil on the RF magnetic field generated around the antenna conductor by the RF current flowing in the RF antenna (the effect of locally decreasing the density of the core plasma generated around the position overlapped with the coil conductor by the inductive coupling) when the RF power is supplied from the RF power supply unit to the RF antenna, and also possible to control the effect of the correction coil (the effect of locally decreasing the density of the core plasma) approximately linearly. Accordingly, the plasma density distribution around the substrate on the substrate supporting unit can be arbitrarily and accurately controlled, and the uniformity of the plasma process can be easily improved.

In accordance with a third aspect of the present invention, there is provided a plasma processing apparatus including: a processing chamber including a dielectric window; a coil-shaped RF antenna, provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate;

an RF power supply unit for supplying an RF power to the RF antenna to generate a plasma of the processing gas by an inductive coupling in the processing chamber, the RF power having an appropriate frequency for RF discharge of the processing gas; a correction coil, provided at a position outside the processing chamber where the correction coil is to be coupled with the RF antenna by an electromagnetic induction, for controlling a plasma density distribution on the substrate in the processing chamber; and a switch provided in a loop of the correction coil.

With such configuration, especially the configuration having the correction coil and the switch, it is possible to selectively obtain the effect of the correction coil on the RF magnetic field generated around the antenna conductor by the RF current flowing in the RF antenna (the effect of locally decreasing the density of the core plasma generated around the position overlapped with the coil conductor by the inductive coupling) when the RF power is supplied from the RF power supply unit to the RF antenna.

In accordance with a fourth aspect of the present invention, there is provided a plasma processing apparatus including: a vacuum-evacuable processing chamber including a dielectric window; an RF antenna, provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate; an RF power supply unit for supplying an RF power to the RF antenna to generate a plasma of the processing gas by an inductive coupling in the processing chamber, the RF power having an appropriate frequency for RF discharge of the processing gas; a first and a second correction coil, provided at positions outside the processing chamber where the first and the second correction coil are to be coupled with the RF antenna by an electromagnetic induction, for controlling a plasma density distribution on the substrate in the processing chamber; and a first and a second switch provided in loops of the first and the second correction coil.

With such configuration, especially the configuration having the first and the second correction coil and the first and the second switch, it is possible to selectively obtain the effect of the correction coil on the RF magnetic field generated around the antenna conductor by the RF current flowing in the RF antenna (the effect of locally decreasing the density of the core plasma generated around the position overlapped with the coil conductor by the inductive coupling) when the RF power is supplied from the RF power supply unit to the RF antenna, and also possible to select various operational effects (profiles) of the correction coil by combining the first and the second coil.

In accordance with a fifth aspect of the present invention, there is provided a plasma processing method for performing a desired plasma process on a substrate by using a plasma processing apparatus including: a processing chamber including a dielectric window; a coil-shaped RF antenna, provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate; and an RF power supply unit for supplying an RF power to the RF antenna to generate a plasma of the processing gas by an inductive coupling in the processing chamber, the RF power having an appropriate frequency for RF discharge of the processing gas, the method including: arranging a correction coil at a position outside the processing chamber in parallel with the RF antenna where the correction coil is to be coupled with the RF antenna by an electromagnetic induction; and controlling a plasma density distribution by controlling an opening/closing state of a switch provided in a loop of the correction coil.

With such configuration, especially, where the correction coil that can be coupled with the RF antenna by the electromagnetic induction is provided outside the processing chamber so as to be in parallel with the RF antenna; and the switch is provided in the loop of the correction coil and the opening/closing (on/off) state thereof is controlled, it is possible to stably obtain in a standardized manner the effect of the correction coil on the RF magnetic field generated around the antenna conductor by the RF current flowing in the RF antenna when the RF power is supplied from the RF power supply unit to the RF antenna (the effect of locally decreasing the density of the plasma generated by the inductive coupling near the position overlapped with the coil conductor). Accordingly, the plasma density distribution near the substrate on the substrate supporting unit can be arbitrarily and accurately controlled, and the uniformity of the plasma process can be easily improved.

In accordance with a sixth aspect of the present invention, there is provided a plasma processing method for performing a desired plasma process on a substrate by using a plasma processing apparatus including: a processing chamber including a dielectric window; a coil-shaped RF antenna, provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate; and an RF power supply unit for supplying an RF power to the RF antenna to generate a plasma of the processing gas by an inductive coupling in the processing chamber, the RF power having an appropriate frequency for RF discharge of the processing gas, the method including: arranging a first and a second correction coil at positions outside the processing chamber in parallel with the RF antenna where the first and the second correction coils are to be coupled with the RF antenna by an electromagnetic induction; and controlling a plasma density distribution by controlling opening/closing states of a first and a second switch provided in loops of the first and the second correction coil, respectively.

With such configuration, especially, where the first and the second correction coil that can be coupled with the RF antenna by the electromagnetic induction are provided outside the processing chamber so as to be in parallel with the RF antenna; and the first and the second switch are provided in the loop of the first and the second correction soil and the opening/closing (on/off) state thereof is controlled, it is possible to stably obtain in a standardized manner the effect of the correction coil on the RF magnetic field generated around the antenna conductor by the RF current flowing in the RF antenna when the RF power is supplied from the RF power supply unit to the RF antenna (the effect of locally decreasing the density of the plasma generated by the inductive coupling near the position overlapped with the coil conductor). Accordingly, the plasma density distribution near the substrate on the substrate supporting unit can be arbitrarily and accurately controlled, and the uniformity of the plasma process can be easily improved.

BRIEF DESCRIPTION OF THE DRAWINGS

The other objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

First Embodiment

A first embodiment of the present invention will be described with reference to FIGS. 1 to 10.

Figure 1:
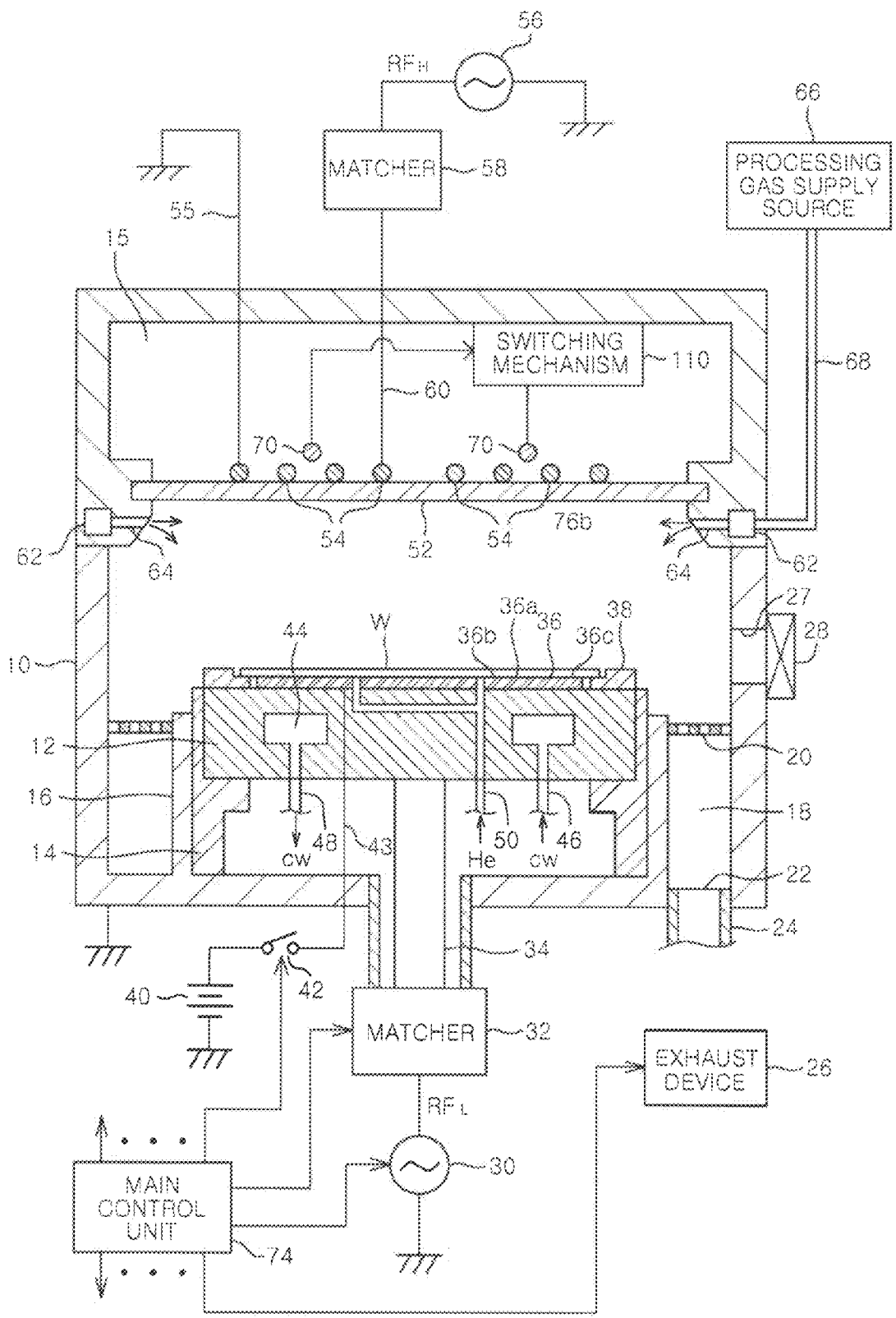
FIG. 1 is a longitudinal cross sectional view showing a configuration of an inductively coupled plasma etching apparatus in accordance with a first embodiment of the present invention.
Figure 2A:
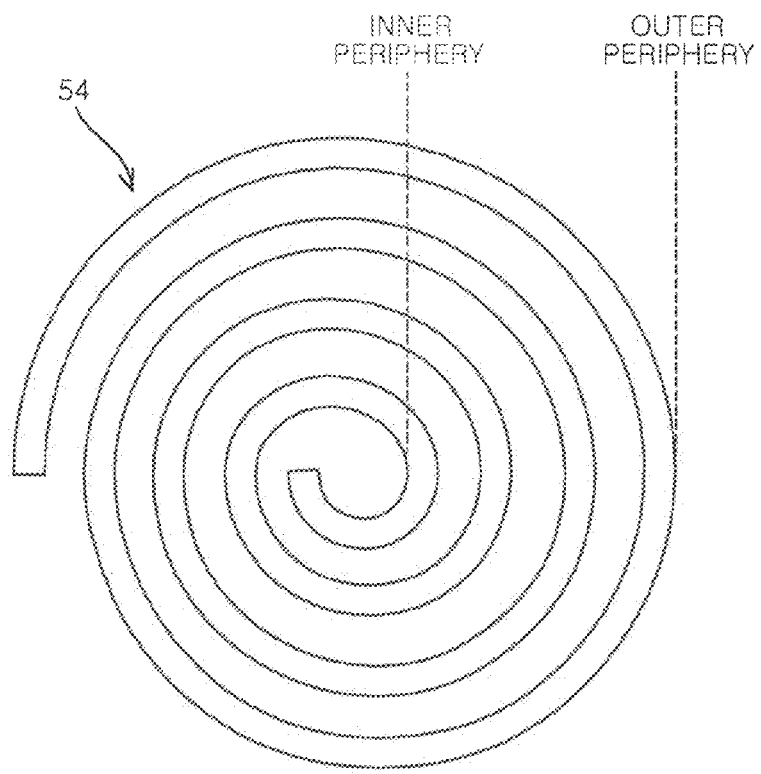
FIG. 2A provides a perspective view showing an example of a spiral coil-shaped RF antenna.
Figure 2B:
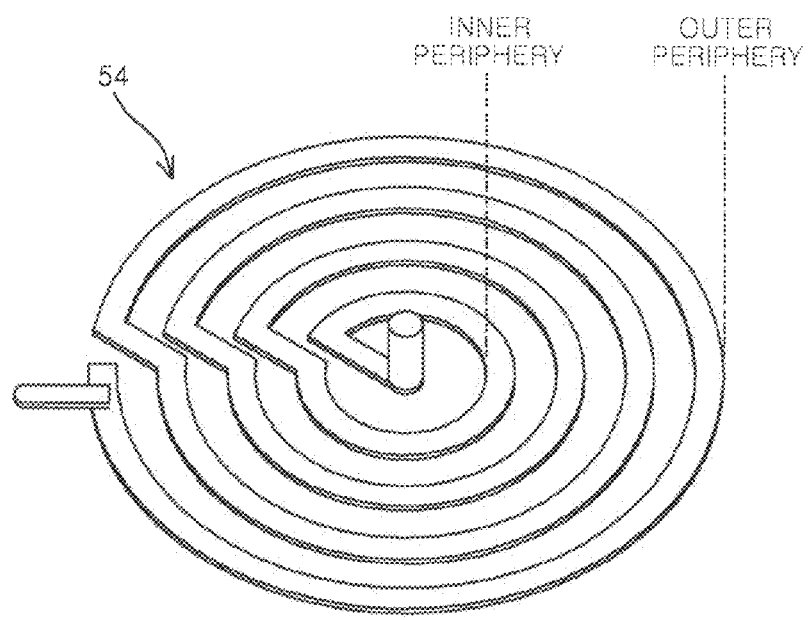
FIG. 2B provides a perspective view showing an example of a concentric coil-shaped RF antenna.

FIG. 1 shows a configuration of an inductively coupled plasma processing apparatus in accordance with the first embodiment of the present invention. The inductively coupled plasma processing apparatus is configured as a plasma etching apparatus using a planar coil type RF antenna, and includes a cylindrical vacuum chamber (processing chamber) 10 made of a metal, e.g., aluminum, stainless steel or the like. The chamber 10 is frame-grounded.

In the inductively coupled plasma etching apparatus, various units having no involvement in plasma generation will be described first.

At a lower central portion of the chamber 10, a circular plate-shaped susceptor 12 for mounting thereon a target substrate, e.g., a semiconductor wafer W as a substrate supporting table is horizontally arranged. The susceptor 12 also serves as an RF electrode. The susceptor 12, which is made of, e.g., aluminum, is supported by an insulating tubular support 14 uprightly extending from a bottom portion of the chamber 10.

A conductive tubular support part 16 is provided uprightly extending from the bottom portion of the chamber 10 along the periphery of the insulating tubular support 14, and an annular exhaust path 18 is defined between the support part 16 and an inner wall of the chamber 10. Moreover, an annular baffle plate 20 is attached to an entrance or a top portion of the exhaust path 18, and an exhaust port 22 is provided at a bottom portion thereof. To allow a gas to uniformly flow in the chamber 10 axisymmetrically with regard to the semiconductor wafer W on the susceptor 12, it is preferable to provide a plural number of exhaust ports 22 at a regular interval circumferentially.

The exhaust ports 22 are connected to an exhaust device 26 via respective exhaust pipes 24. The exhaust device 26 includes a vacuum pump such as a turbo molecular pump to evacuate a plasma-processing space in the chamber 10 to a predetermined vacuum level. Attached to the sidewall of the chamber 10 is a gate valve 28 for opening and closing a loading/unloading port 27.

An RF power supply 30 for an RF bias is electrically connected to the susceptor 12 via a matcher 32 and a power supply rod 34. The RF power supply 30 outputs a variable RF power $RF_L$ of an appropriate frequency (e.g., 13.56 MHz or less) to control the energies of ions attracted toward the semiconductor wafer W. The matcher 32 includes a variable-reactance matching circuit for performing the matching between the impedances of the RF power supply 30 and the load (mainly, susceptor, plasma and chamber), and the matching circuit includes a blocking capacitor for generating a self-bias.

An electrostatic chuck 36 is provided on an upper surface of the susceptor 12 to hold the semiconductor wafer W by an electrostatic attraction force, and a focus ring 38 is provided around the electrostatic chuck 36 to annularly surround the periphery of the semiconductor wafer W. The electrostatic chuck 36 includes an electrode 36a made of a conductive film and a pair of dielectric films 36b and 36c. A high voltage DC power supply 40 is electrically connected to the electrode 36a via a switch 42 by using a coated line 43. By applying a high DC voltage from the DC power supply 40 to the electrode 36a, the semiconductor wafer W can be attracted to and held on the electrostatic chuck 36 by the electrostatic force.

An annular coolant channel or coolant path 44, which extends in, e.g., a circumferential direction, is provided inside the susceptor 12. A coolant, e.g., a cooling water, of a predetermined temperature is supplied from a chiller unit (not shown) to the coolant path 44 to be circulated through pipelines 46 and 48. By adjusting the temperature of the coolant, it is possible to control a process temperature of the semiconductor wafer W held on the electrostatic chuck 36. Moreover, a heat transfer gas, e.g., He gas, is supplied from a heat transfer gas supply unit (not shown) to a space between a top surface of the electrostatic chuck 36 and a bottom surface of the semiconductor wafer W through a gas supply line 50. Further, an elevating mechanism (not shown) including lift pins capable of being moved up and down while vertically extending through the susceptor 12 and the like is provided to load and unload the semiconductor wafer W.

Next, various units having involvement in the plasma generation in the inductively coupled plasma etching apparatus will be described.

A ceiling of the chamber 10 is separated from the susceptor 12 at a relatively large distance, and a circular dielectric window 52 formed of, e.g., a quartz plate is airtightly provided in the ceiling. In general, a coil-shaped RF antenna 54 is horizontally provided on the dielectric window 52 so as to be concentric with the chamber 10 or the susceptor 12. The RF antenna 54 preferably has, e.g., a spiral coil shape (see FIG. 2A) or a shape of one or more concentric coils, each circular cycle having a same radius (see FIG. 2B), and is fixed onto the dielectric window 52 by an antenna fixing member (not shown) made of an insulating material.

One end of the RF antenna 54 is electrically connected to an output terminal of the RF power supply 56 for plasma generation via a matcher 58 and a power supply line 60. Although it is not illustrated, the other end of the RF antenna 54 is electrically connected to a ground potential through a ground line.

The RF power supply 56 outputs an RF power $RF_H$ of an appropriate frequency (e.g., 13.56 MHz or more) for plasma generation by RF discharge at a desired level. The matcher 58 includes a variable-reactance matching circuit for performing the matching between the impedances of the RF power supply 56 and the load (mainly, RF antenna, plasma and correction coil).

A processing gas supply unit for supplying a processing gas to the chamber 10 includes an annular manifold or buffer unit 62 provided inside (or outside) the sidewall of the chamber 10 to be located at a place slightly lower than the dielectric window 52; a plurality of sidewall gas injection holes 64 circumferentially formed on the sidewall at a regular interval and opened to the plasma-generation space from the buffer unit 62; and a gas supply line 68 extended from the processing gas supply source 66 to the buffer unit 62. The processing gas supply source 66 includes a mass flow controller and an on-off valve, which are not shown.

In order to variably control a density distribution of an inductively coupled plasma generated in a processing space of the chamber 10 in the diametric direction, the inductively coupled plasma etching apparatus includes a correction coil 70 capable of being coupled to the RF antenna 54 by an electromagnetic induction; and a switching mechanism 110 controlling the duty ratio of the induced current flowing in the correction coil 70 in the antenna chamber serving as an atmospheric space provided above a ceiling wall (ceiling plate) of the chamber 10. The detailed configurations and functions of the correction coil 70 and the switching mechanism 110 will be described later.

A main control unit 74 includes, e.g., a microcomputer and controls the overall operation (sequence) of the plasma etching apparatus and individual operations of various units, e.g., the exhaust device 26, the RF power supplies 30 and 56, the matchers 32 and 58, the switch 42 of the electrostatic chuck, the processing gas supply source 66, the switching mechanism 110, the chiller unit (not shown), the heat-transfer gas supply unit (not shown) and the like.

When the inductively coupled plasma etching apparatus performs an etching process, the gate valve 28 is first opened to load a target substrate, i.e., a semiconductor wafer W, into the chamber 10 and mount it onto the electrostatic chuck 36. Then, the gate valve 28 is closed, and an etching gas (typically, a gaseous mixture) is introduced from the processing gas supply source 66, via the buffer unit 62, into the chamber 10 at a preset flow rate and flow rate ratio through the sidewall gas injection holes 64 by using the gas supply line 68. Thereafter, the RF power supply unit 56 is turned on to output a plasma-generating RF power $RF_H$ at a predetermined RF level, so that a current of the RF power $RF_H$ is supplied to the RF antenna 54 through the RF power supply line 60 via the matcher 58. In addition, the RF power supply 30 is turned on to output an ion-attracting control RF power $RF_L$ at a predetermined RF level, so that the RF power $RF_L$ is supplied to the susceptor 12 through the power supply rod 34 via the matcher 32.

Further, a heat-transfer gas (i.e., He gas) is supplied from the heat-transfer gas supply unit to a contact interface between the electrostatic chuck 36 and the semiconductor wafer W, and the switch is turned on, so that the heat-transfer gas is confined in the contact interface by the electrostatic attraction force of the electrostatic chuck 36.

The etching gas injected through the sidewall gas injection holes 64 is uniformly diffused in the processing space below the dielectric window 52. At this time, the RF magnetic field is generated around the RF antenna 54 by the current of the RF power $RF_H$ flowing through the RF antenna 54, so that magnetic force lines travel through the dielectric window 52 and across the plasma generation space in the chamber and, thus, an RF electric field is induced in the azimuthal direction of the processing space by the temporal alteration of the RF magnetic field.

Then, electrons azimuthally accelerated by the induced electric field collide with molecules and/or atoms in the etching gas, to thereby ionize the etching gas and generate a plasma in a doughnut shape. In the wide processing space, radicals and ions of the plasma generated in the doughnut shape are diffused in all directions, so that the radicals isotropically pour down and the ions are attracted by the DC bias onto a top surface (target surface) of the semiconductor wafer W. Accordingly, plasma active species cause chemical and physical reactions on the target surface of the semiconductor wafer W, thereby etching a target film into a predetermined pattern.

As such, in the inductively coupled plasma etching apparatus, an inductively coupled plasma is generated in the doughnut shape below the dielectric window 52 around the RF antenna 54 and then diffused in the large processing space, so that the density of the plasma becomes uniform around the susceptor 12 (i.e., on the semiconductor wafer W). Here, the density of the doughnut-shaped plasma depends on the intensity of the induced electric field and, furthermore, the magnitude of the RF power $RF_H$ supplied to the RF antenna (more specifically, the current flowing in the RF antenna 54). In other words, as the RF power $RF_H$ is increased, the density of the doughnut-shaped plasma is increased and, thus, the plasma density around the susceptor 12 is generally increased.

Meanwhile, the shape in which the plasma in the doughnut shape is diffused in all directions (especially, in the diametric direction) mainly depends on the pressure inside the chamber 10 and, thus, as the pressure becomes decreased, amount of the plasma accumulated on a central portion of chamber 10 is increased, so that the density distribution of the plasma around the susceptor 12 tends to be swollen at the central portion. Further, the density distribution of the plasma in the doughnut shape may be changed depending on the magnitude of the RF power $RF_H$ supplied to the RF antenna 54, the flow rate of the processing gas introduced into the chamber 10, or the like.

Here, the expression "plasma in a doughnut shape" indicates not only a state where the plasma is generated only at the radially outer portion in the chamber 10 without being generated at the radially inner portion (at the central portion) therein but also a state where the volume or density of the plasma generated at the radially outer portion becomes larger than that at the radially inner portion. Moreover, if the kind of the processing gas, the pressure inside the chamber 10 and/or the like are changed, the plasma may be generated in another shape instead of the doughnut shape.

In such plasma etching apparatus, to freely control the density distribution of the plasma in the doughnut shape around the susceptor 12, the RF antenna 54 performs an electromagnetic field correction on the generated RF magnetic field by the correction coil 70 and controls the duty ratio of the induced current flowing in the correction coil 70 by the switching mechanism 110 depending on predetermined process parameters (e.g., pressure in the chamber and the like) that are set up in a process recipe.

Hereinafter, the configurations and functions of the correction coil 70 and the switching mechanism 110 as major features of the plasma etching apparatus will be described.

Figure 6:
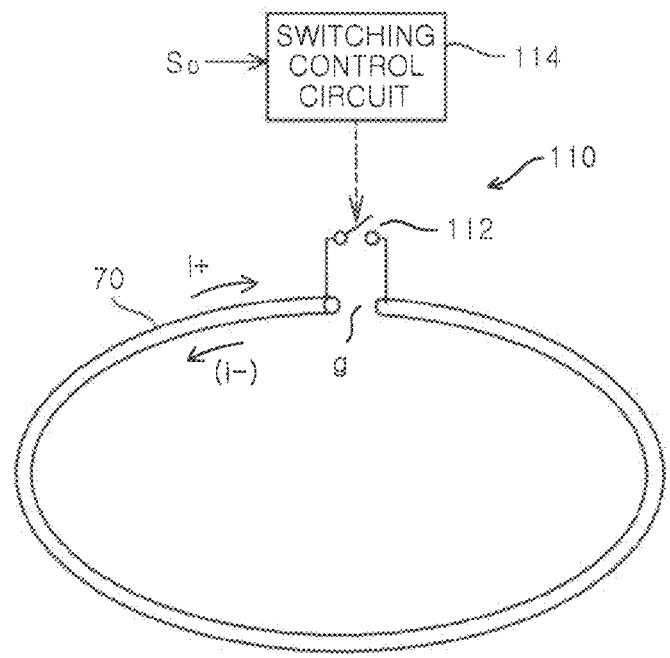
FIG. 6 shows examples of a correction coil and a switching mechanism in accordance with the first embodiment of the present invention.

More specifically, as shown in FIG. 6, the correction coil 70 is formed of a circular ring-shaped single- or multi-wound coil having closed ends with a gap g therebetween, and is arranged to be concentric with the RF antenna 54 such that its coil conductor is diametrically positioned between the inner periphery and the outer periphery of the RF antenna 54 (preferably, around the middle portion therebetween). Further, the correction coil is horizontally supported by an insulating coil supporting body (not shown) at a certain vertical position close to the RF antenna 54. The correction coil 70 is preferably made of, e.g., a copper-based material having a high conductivity.

In the present embodiment, the expression "concentric" indicates a positional relationship in which central axial lines of a plurality of coils or antennas are overlapped with each other, including not only a case where coil surfaces or antenna surfaces are axially or vertically offset to each other but also a case where the coil surfaces or the antenna coil surfaces are identical to each other on the same plane (concentric positional relationship).

Here, an endless correction coil 70' corresponding to the correction coil 70 having no gap g is used, and the operation of altering the vertical position of the endless correction coil 70' will be described.

Figure 3A:
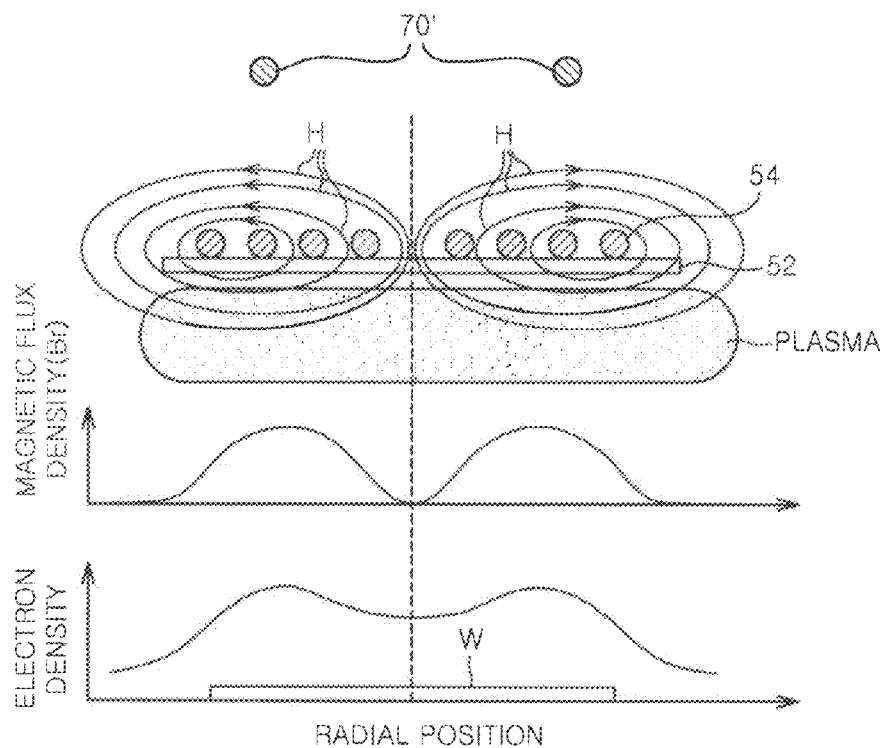
FIG. 3A schematically shows an example of an effect of an electromagnetic field when an endless correction coil is arranged away from an RF antenna.

As shown in FIG. 3A, when the vertical position of the endless correction coil 70' is set near the upper limit, an RF magnetic field H generated around the antenna conductor by the current of the RF power $RF_H$ flowing in the RF antenna 54 produces loop-shaped magnetic force lines which radially travel through the processing space provided below the dielectric window 52 without being affected by the endless correction coil 70'.

The radial (horizontal) component Br of the magnetic flux density in the processing space is constantly zero at the central and the peripheral portion of the chamber 10 regardless of the magnitude of the current of the RF power $RF_H$, and has a local maximum value at a position overlapped with the middle portion (hereinafter, referred to as "antenna middle portion") between the inner periphery and the outer periphery of the RF antenna 54. As the current of the RF power $RF_H$ is increased, the local maximum value is increased. The intensity distribution of the induced electric field generated in the azimuthal direction by the RF magnetic field RF shows the same profile as that of the radial distribution of the magnetic flux density Br. Accordingly, the plasma is generated in a doughnut shape near the dielectric window 52 so as to be concentric with the RF antenna 54.

The doughnut-shaped plasma is diffused in all directions (especially, in the radial direction) in the processing space. As described above, the diffusion shape thereof depends on the pressure inside the chamber 10. For example, as shown in FIG. 3A, the radial electron density (plasma density) around the susceptor 12 may show a profile in which it has a relatively high value (local maximum value) at a portion corresponding to the antenna middle portion and is significantly decreased around the central and the peripheral portion.

Figure 3B:
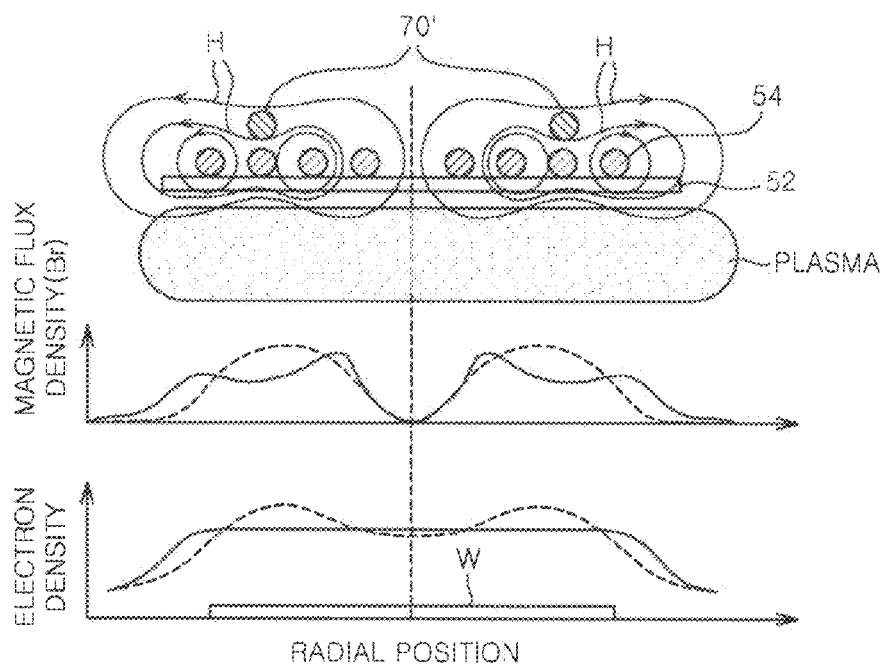
FIG. 3B schematically shows an example of an effect of an electromagnetic field when the endless correction coil is arranged close to the RF antenna.

In this case, as shown in FIG. 3B, if the vertical position of the endless correction coil 70' is lowered to, e.g., near the lower limit, the RF magnetic field H generated around the antenna conductor by the current of the RF power $RF_H$ which flows in the RF antenna 54 is affected by the reaction of the electromagnetic induction due to the presence of the endless correction coil 70'. The reaction of the electromagnetic induction indicates an action against the alteration of the magnetic force lines (magnetic flux) traveling through the loop of the endless correction coil 70'. An electromotive force is induced by the alteration of the magnetic force lines, thereby allowing a current to flow in the loop of the endless correction coil 70'.

Due to the reaction of the electromagnetic induction from the endless correction coil 70', the radial (horizontal) component Br of the magnetic flux density in the processing space close to the dielectric window 52 becomes weak locally at the portion immediately below the coil conductor of the endless correction coil 70' (especially, the antenna middle portion). Accordingly, the intensity of the induced electric field generated in the azimuthal direction also becomes weak locally at the portion corresponding to the antenna middle portion. Resultantly, the uniformity of the radial electron density (plasma density) around the susceptor 12 is improved.

Figure 4A:
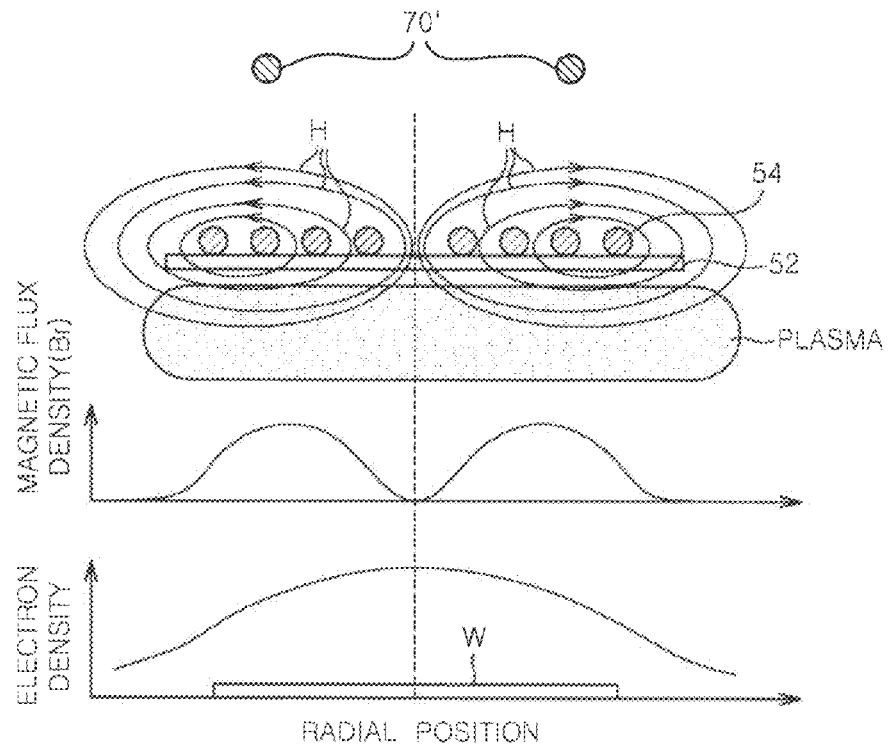
FIG. 4A schematically shows another example of the effect of an electromagnetic field when the endless correction coil is arranged away from the RF antenna.

The diffusion shape of the plasma shown in FIG. 3A is merely an example. For example, when the pressure is low, the plasma is excessively accumulated at the central portion of the chamber 10, so that the electron density (plasma density) around the susceptor 12 shows a mountain-shaped profile in which it has a relatively local maximum value at the central portion, as shown in FIG. 4A.

Figure 4B:
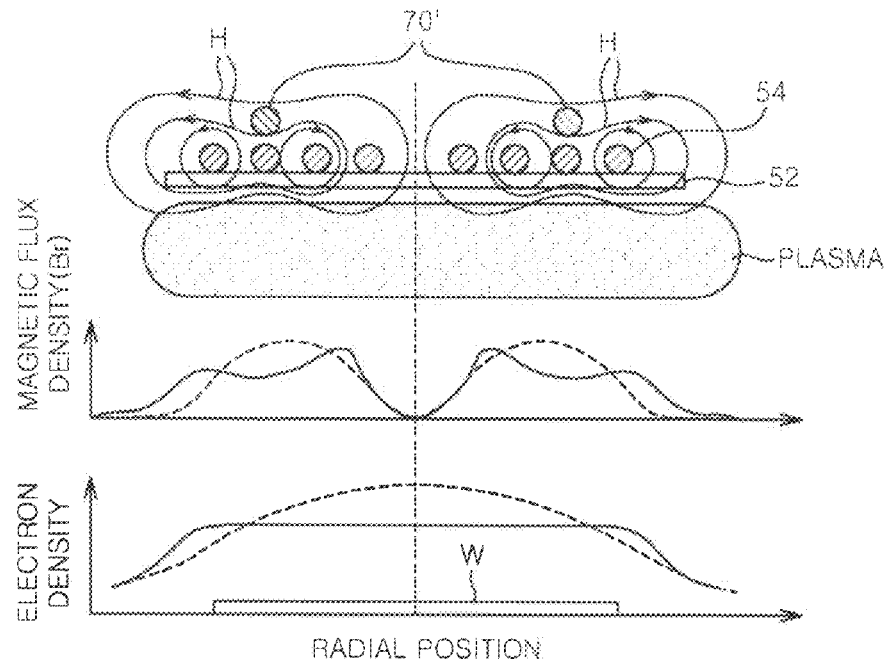
FIG. 4B schematically shows another example of the effect of an electromagnetic field when the endless correction coil is arranged close to the RF antenna.

In this case, as shown in FIG. 4B, if the endless correction coil 70' is lowered to, e.g., near the lower limit, the radial (horizontal) component Br of the magnetic flux density in the processing space close to the dielectric window 52 becomes weak locally at the middle portion overlapped with the coil conductor of the endless correction coil 70'. Accordingly, the accumulation of the plasma becomes weak at the central portion of the chamber, and the uniformity of the plasma density is improved in the diametric direction around the susceptor 12.

The present inventors have verified the above-described effect due to the endless correction coil 70' through the following electromagnetic system simulations. Specifically, the vertical positions (distance) of the endless correction coil 70' relative to the RF antenna 54 were set to be, e.g., 5 mm, 10 mm and 20 mm and infinite (no correction coil) as parameters, and the distribution of the current density (corresponding to the plasma density distribution) in the radial direction was obtained at a portion (separated from the top surface by about 5 mm) in the doughnut-shaped plasma. As a result, the verification result shown in FIG. 5 was obtained.

In the electromagnetic system simulations, the outer radius of the RF antenna 54 was set to be, e.g., 250 mm; and the inner radius and the outer radius of the endless correction coil 70' were respectively set to be, e.g., 100 mm and 130 mm. As the plasma generated in the doughnut shape in the processing space below the RF antenna 54 by the inductive coupling, a disk-shaped resistance was simulated, where its radius, resistivity and skin depth were set to be, e.g., 500 mm, 100 Ωcm and 10 mm, respectively. The plasma-generating RF power $RF_H$ had a frequency of about 13.56 MHz.

Figure 5:
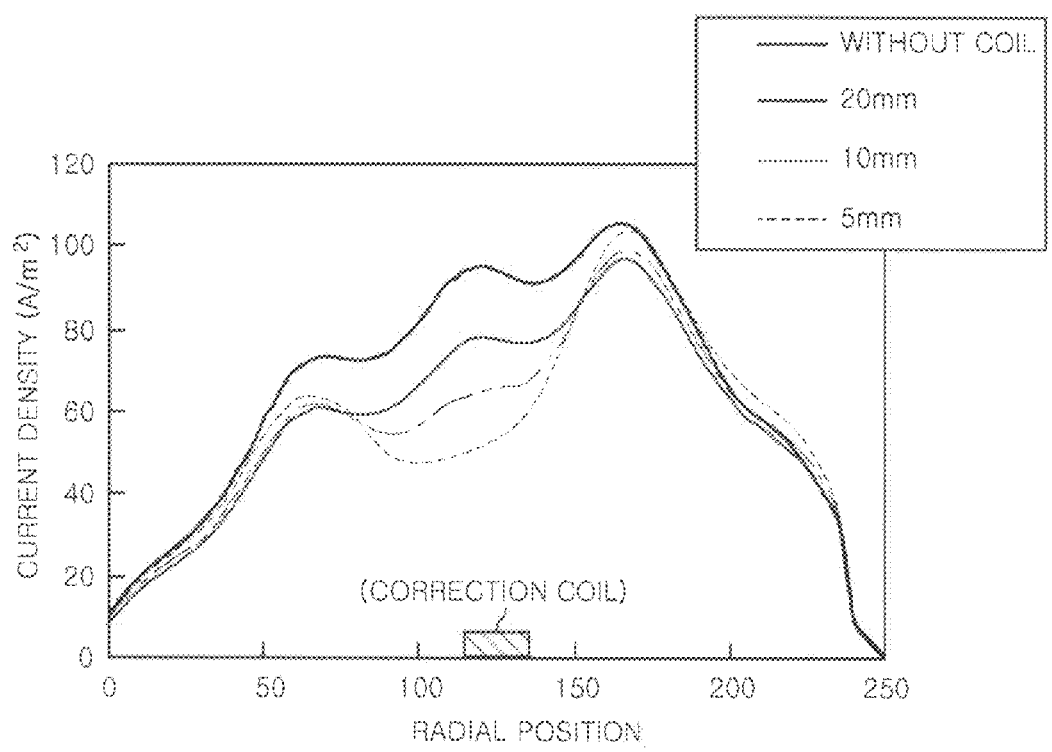
FIG. 5 illustrates changes in the current density distribution in a processing space around a dielectric window in the case of changing a distance between the endless correction coil and the RF antenna.

FIG. 5 shows that, when the endless correction coil 70' is arranged at the vertical position such that the endless correction coil 70' is coupled with the RF antenna 54 by an electromagnetic induction, the plasma density in the doughnut-shaped plasma is locally decreased around the position overlapped with the coil conductor of the correction coil 70 (position overlapped with the antenna middle portion in FIG. 5) and such local decrease in the plasma density becomes larger approximately linearly as the endless correction coil 70' becomes closer to the RF antenna 54.

In the inductively coupled plasma etching apparatus (see FIG. 1) of the present embodiment, as shown in FIG. 6, a correction coil 70 formed of a single-wound coil (or a multi-wound coil) having both open ends with a gap g therebetween is used instead of the endless correction coil 70', and a switching device 112 is connected between both ends.

A switching mechanism 110 includes a switching control circuit 114 for on/off controlling or switching-controlling the switching device 112 by pulse width modulation (PWM) at a predetermined frequency (e.g., about 1 to 100 kHz).

Figure 7:
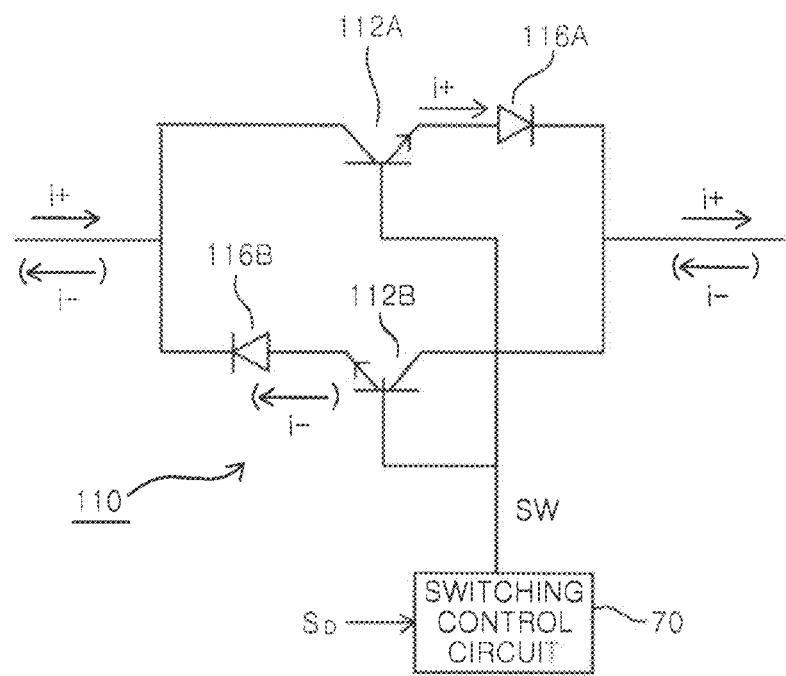
FIG. 7 shows a specific example of the switching mechanism.

FIG. 7 shows a specific configuration example of the switching mechanism 110. In this example, a pair of transistors (e.g., IGBT or MOS transistors) 112A and 112B serving as the switching device 112 is connected in parallel with each other in opposite directions, and reverse-bias protection diodes 116A and 116B are connected in series with the transistors 112A and 112B, respectively.

The transistors 112A and 112B are switched on/off at the same time by a PWM control signal SW from the switching control circuit 114. When the transistors 112A and 112B are switched on, a positive induced current i+ flowing in the correction coil 70 in a normal direction during a first half cycle of the high frequency flows through the first transistor 112A and the first diode 116A, and a negative induced current i− flowing in a reverse direction in the correction coil 70 during a second half cycle of the high frequency flows through the second transistor 112B and the second diode 116B.

Although it is not illustrated, the switching control circuit 114 includes, e.g., a triangular wave generating circuit for generating a triangular wave signal having a predetermined frequency; a variable voltage signal generating circuit for generating a voltage signal at a variable voltage level corresponding to a desired duty ratio (a ratio of an ON period to one pulse cycle); a comparator for comparing the voltage levels of the triangular wave signal and the variable voltage signal and generating a binary PWM control signal SW based on the differences in the voltage levels; and a driving circuit for driving the transistors 112A and 112B by the PMW control signal SW. Here, a desired duty ratio is applied from the main control unit 74 to the switching control circuit 114 by a predetermined control signal $S_D$.

Figure 8:
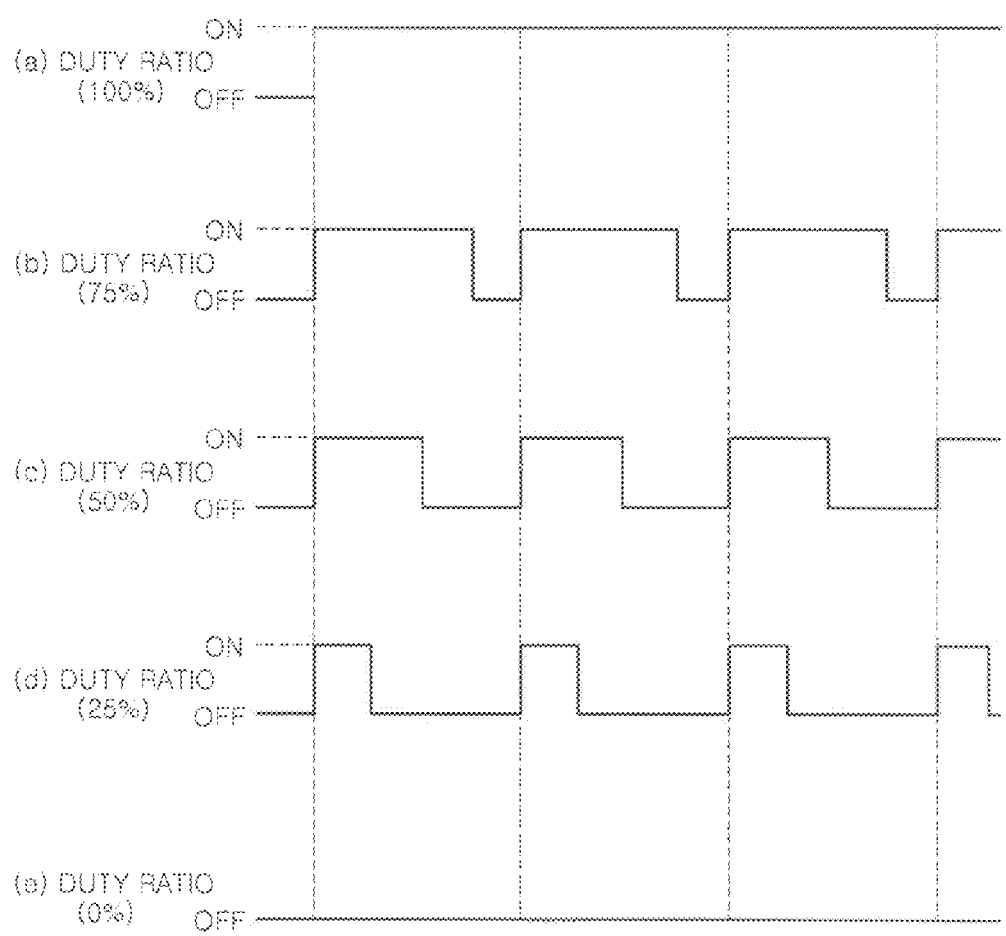
FIG. 8 describes PWM control using the switching mechanism.
Figure 9:
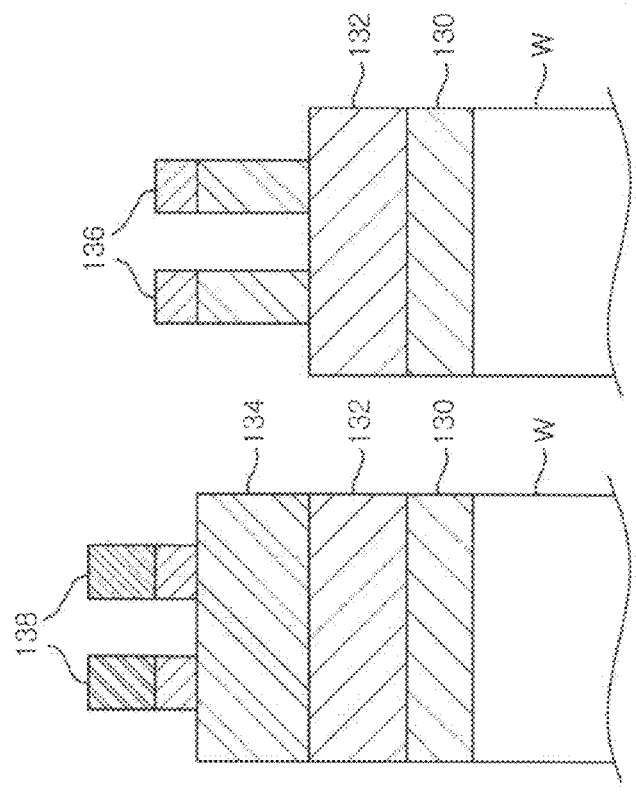
FIGS. 9A to 9D stepwisely show a process of a multilayer resist method.

In accordance with the present embodiment, the switching mechanism 110 configured as described above can control the duty ratio of the correction coil 70 during the plasma processing by the PWM control, and also can arbitrarily and variably control the duty ratio within a range of about 0% to 100% as shown in FIG. 8.

Here, it should be noted that the arbitrary adjustment of the duty ratio of the induced current i flowing in the correction coil 70 within the range of about 0% to 100% by the PWM control is functionally equivalent to the arbitrary adjustment of the vertical position of the endless correction coil 70' between a home position $H_P$ close to the upper limit and the lower limit close to the RF antenna 54. From a different standpoint, the characteristics shown in FIG. 5 can be achieved in the inductively coupled plasma etching apparatus by fixing the correction coil 70 to the vertical position close to the RF antenna 54 by the switching mechanism 110. Accordingly, the degree of freedom and the accuracy in controlling the plasma density distribution can be improved easily.

By variably controlling the duty ratio of the correction coil 70 by the switching mechanism 110 whenever the process conditions of the process recipe are entirely or partially changed, it is possible to arbitrarily and accurately control the operation of the correction coil 70 with regard to the RF magnetic field H generated around the antenna conductor by the current of the RF power $RF_H$ which flows in the RF antenna 54, i.e., the degree (strength and weakness) of the effect of locally decreasing the plasma density in the doughnut-shaped plasma around the position overlapped with the coil conductor of the correction coil 70.

The inductively coupled plasma etching apparatus of the present embodiment may be preferably applied to, e.g., the application for continuously etching a multilayered film on the surface of a target substrate at a plurality of steps. Hereinafter, a multilayer resist method shown in FIGS. 9A to 9D in accordance with the first embodiment of the present invention will be described.

As shown in FIGS. 9A to 9D, in a main surface of the semiconductor wafer W serving as a target substrate to be processed, an SiN layer 102 serving as a lowermost layer (final mask) is formed on an original target film 100 (e.g., a gate Si film) to be processed. An organic film (e.g., carbon film) 104 serving as an intermediate layer is formed on the SiN layer 102. A photoresist 108 serving as an uppermost layer is formed on the organic film 104 via a Si-containing bottom anti-reflective coating (BARC) film 106. The SiN layer 102, the organic film 104 and the BARC film 106 are formed by using the chemical vapor deposition (CVD) or the spin-on coating method. The photoresist 108 is patterned by the photolithography.

First, in a first etching process step, as shown in FIG. 9A, the Si-containing BARC film 106 is etched by using the patterned photoresist 108 as a mask. In this case, a gaseous mixture of $CF_4$ gas and $O_2$ gas is employed as an etching gas, and the pressure inside the chamber 10 is set to be relatively low, e.g., 10 mTorr.

Next, in a second etching process step, as shown in FIG. 9B, the organic film 104 is etched by using as a mask the photoresist 108 and the BARC film 106. In this case, a single $O_2$ gas is employed as an etching gas, and the pressure inside the chamber 10 is set to be relatively lower, e.g., 5 mTorr.

Finally, in a third etching process step, as shown in FIGS. 9C and 9D, the SiN layer 102 is etched by using as a mask the patterned BARC 106 and the organic film 104. In this case, a gaseous mixture of $CHF_3$ gas, $CF_4$ gas, Ar gas and $O_2$ gas is employed as an etching gas, and the pressure inside the chamber 10 is set to be relatively high, e.g., 50 mTorr.

In such multiple etching process steps, the process conditions are entirely or partially (especially, the pressure in the chamber 10) changed and, thus, the plasma generated in the doughnut shape is diffused in another form in the processing space. Here, in case that the correction coil 70 is not operated (electrically connected), the electron density (plasma density) around the susceptor 12 in the first and the second step (pressure of 10 mTorr or less) show a precipitous mountain-shaped profile in which it has a relatively significantly high value at the central portion, as illustrated in FIG. 4A. The electron density in the third step (pressure of 50 mTorr) has a gentle mountain-shaped profile in which it has a slightly high value at the central portion.

In accordance with the present embodiment, in, e.g., a process recipe, the duty ratio of the correction coil 70 is set as one of the process parameters or recipe information as a specification that is added into or related to typical process conditions (such as magnitude of the RF power, pressure, gas type, gas flow rate and the like). Then, when the multiple etching process steps are performed, the main control unit 74 reads out data corresponding to the duty ratio of the correction coil 70 from a memory and, at each step, sets the duty ratio of the correction coil 70 to a setting value by using the switching mechanism 110.

Figure 10:
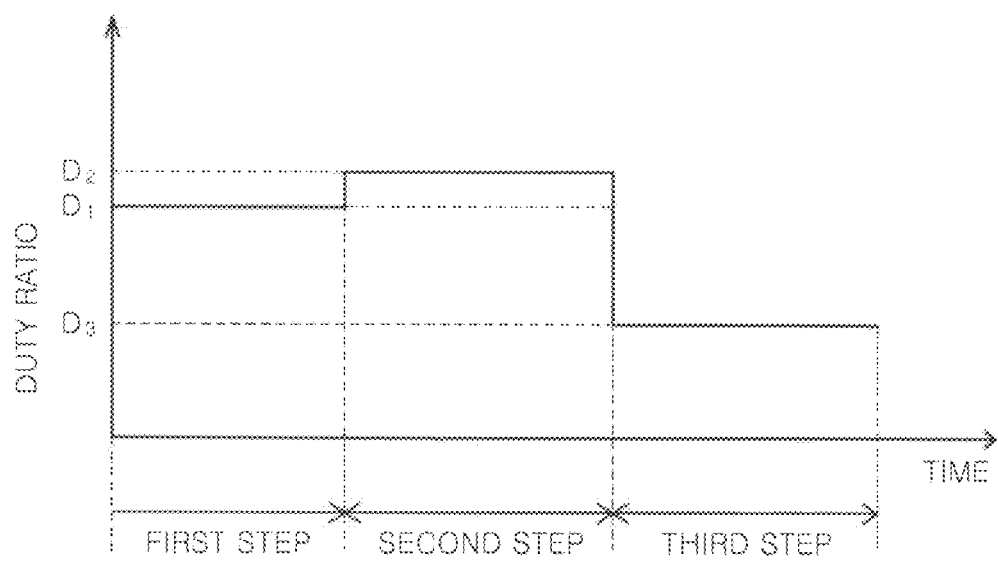
FIG. 10 explains a method for variably controlling a duty ratio of the correction coil in multiple etching process steps of the multilayer resist method.

For example, in the etching process steps of the multilayer resist method shown in FIGS. 9A to 9D, at each step of the first step (10 mTorr), the second step (5 mTorr) and the third step (50 mTorr), the duty ratio of the correction coil 70 are respectively converted, into a relatively high duty ratio $D_1$, a higher duty ratio $D_2$, and a relatively low duty ratio $D_3$, as shown in FIG. 10.

In view of the plasma ignitability, it is effective to maintain the electrical connection of the correction coil 70 in the off state so that the plasma can be stably ignited immediately after the process of each step is initiated and then set the duty ratio to the setting value after the plasma ignition.

Second Embodiment

Hereinafter, a second embodiment of the present invention will be described with reference to FIGS. 11 to 14.

Figure 11:
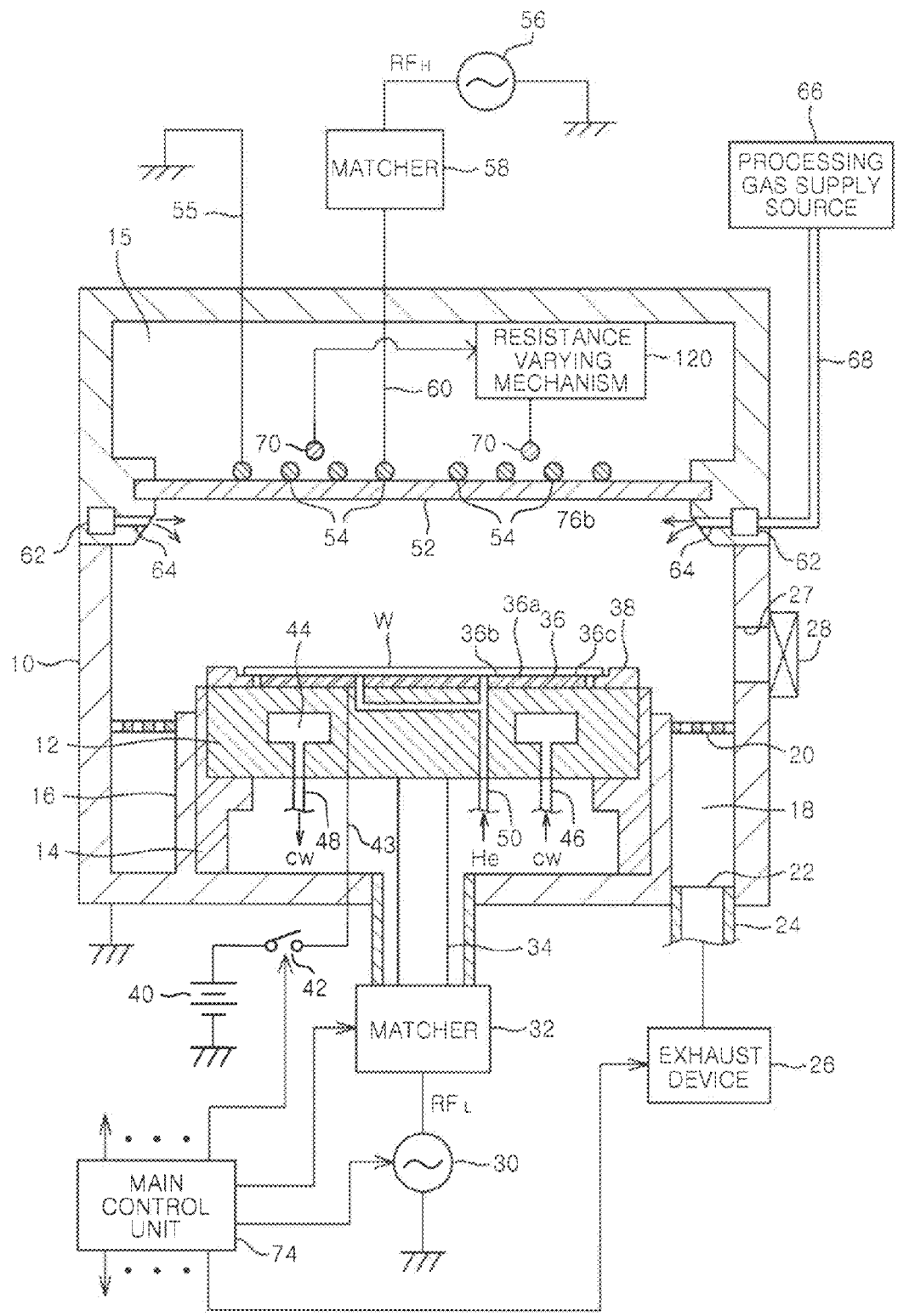
FIG. 11 is a longitudinal cross sectional view showing a configuration of an inductively coupled plasma etching apparatus in accordance with a second embodiment of the present invention.

FIG. 11 shows a configuration of an inductively coupled plasma etching apparatus in accordance with the second embodiment of the present invention. In FIG. 11, like reference numerals are used for like parts having the same configurations or functions as those of the apparatus of the first embodiment (see FIG. 1).

The characteristics of the second embodiment are different from those of the first embodiment in that a resistance varying mechanism 120 is provided instead of the switching mechanism 110.

More specifically, the correction coil 70 is formed of a single- or multi-wound coil having open ends with a gap g therebetween, and is arranged to be concentric with the RF antenna 54 such that its coil conductor is diametrically positioned between the inner periphery and the outer periphery of the RF antenna 54 (preferably, around the middle portion therebetween). Further, the correction coil is horizontally supported by an insulating coil supporting body (not shown) at a vertical position close to the RF antenna 54.

Figure 12:
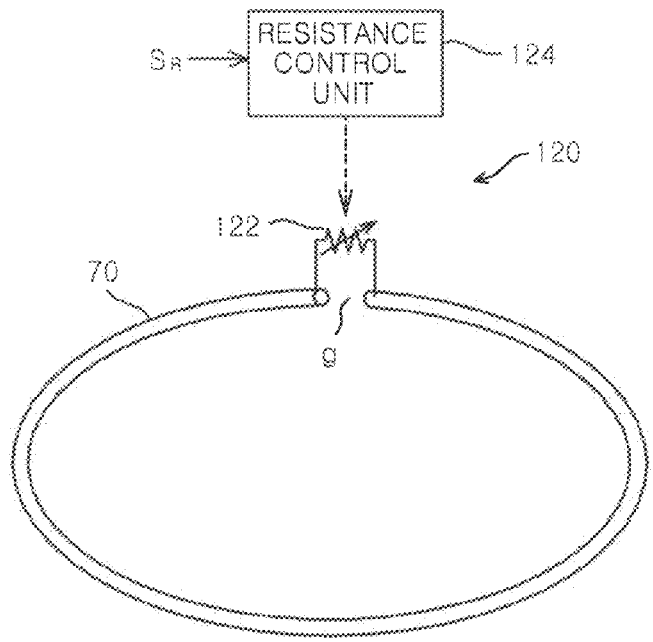
FIG. 12 shows examples of a correction coil and a resistance varying mechanism in accordance with the second embodiment of the present invention.

As shown in FIG. 12, the resistance varying mechanism 120 includes a variable resistor 122 connected to both ends of the correction coil 70, and a resistance control unit 124 for controlling a resistance value of the variable resistor 122 to a desired value.

Figure 13:
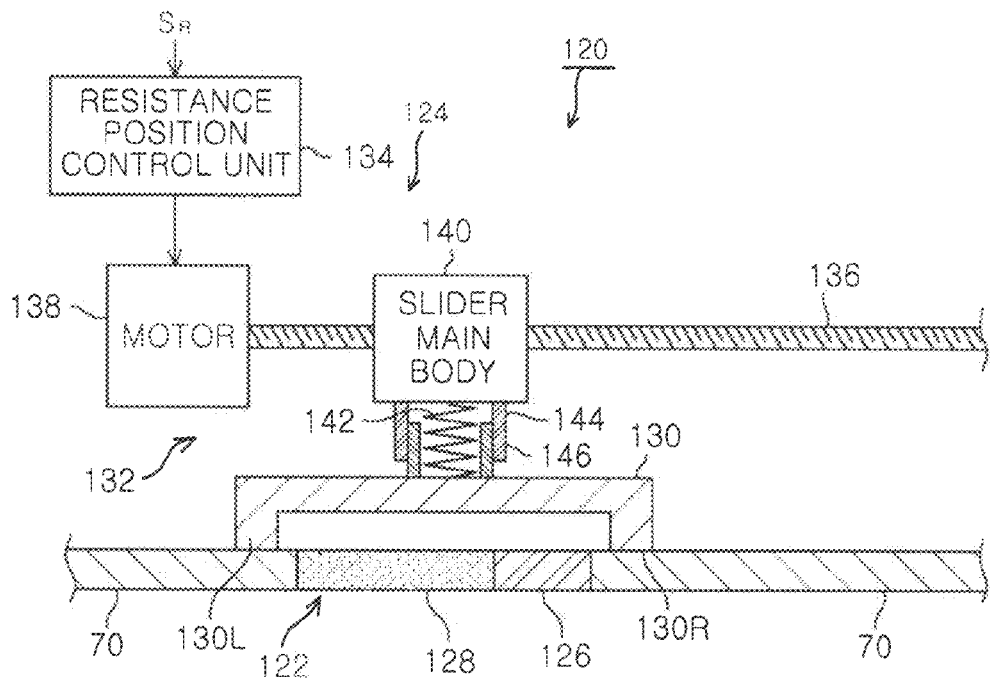
FIG. 13 shows a specific example of the resistance varying mechanism.

FIG. 13 shows a specific configuration example of the resistance varying mechanism 120. In this configuration example, the variable resistor 122 includes a metal- or carbon-based resistor element 128 that has a high conductivity and is inserted between both ends of the correction coil 70 so as to block the gap g therebetween, and a bridge type short circuit conductor 130 that short-circuits two points spaced apart from each other at a predetermined distance on the correction coil 70. The bridge type short circuit conductor 130 is preferably made of, e.g., a copper-based metal having a high conductivity.

The resistance control unit 124 includes a slide mechanism 132 for supporting and slidably moving the bridge type short circuit conductor 130 on the correction coil 70, and a resistance position control unit 134 for setting a position of the bridge type short circuit conductor 130 to a desired resistance position by using the slide mechanism 132.

More specifically, the slide mechanism 132 includes: a stepping motor 138 including a ball screw mechanism, for rotating a feed screw 136 extending horizontally at a predetermined position; a slider main body 140 that has a nut portion (not shown) to be screwed on the feed screw 136 and moves horizontally along the axial direction of the feed screw 136 by the rotation of the feed screw 136; a compression coil spring 142 for coupling the slider main body 140 and the bridge type short circuit conductor 130; and a pair or cylindrical bodies 144 and 146 that are fitted to each other slidably in the vertical direction. Here, the outer cylindrical body 144 is fixed to the slider main body 140, and the inner cylindrical body 146 is fixed to the bridge type short circuit conductor 130. The bridge type short circuit conductor 130 is firmly pressed against the correction coil 70 by the elastic force of the compression coil spring 142.

The resistance position control unit 134 controls the position of the bridge type short circuit conductor 130 by controlling the rotation direction and the rotation amount of the stepping motor 138. A target position of the bridge type short circuit conductor 130 is transmitted from the main control unit 74 (see FIG. 11) to the resistance position control unit 134 by a predetermined control signal $S_R$.

Hereinafter, the operation of the resistance varying mechanism 120 will be described with reference to FIGS. 13 and 14A to 14C.

When the bridge type short circuit conductor 130 is set to a position shown in FIG. 13, both ends of the coil conductor of the correction coil 70 are bypassed and short-circuited by the bridge type short circuit conductor 130 without passing through the resistor element 128. Accordingly, the resistance of the variable resistor 122 becomes lowest (substantially zero) and, resultantly, the entire coil resistance of the correction coil 70 becomes lowest.

Figure 14A:
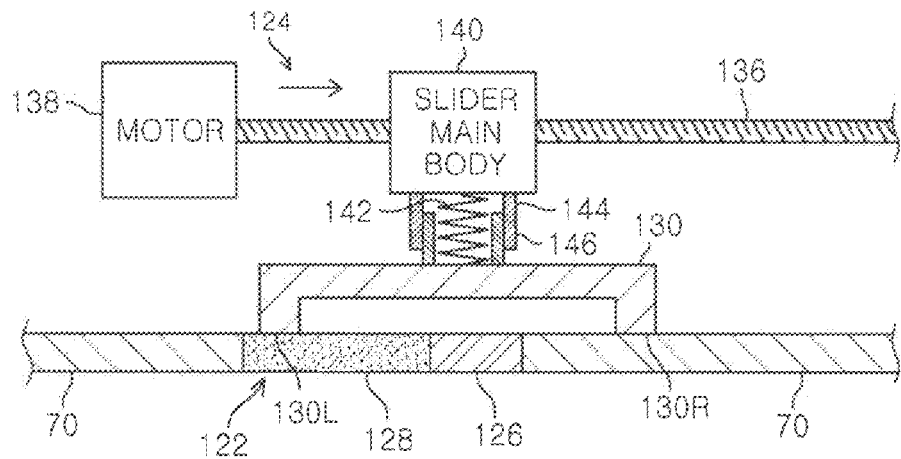
FIG. 14A depicts a position of a resistor in the resistance varying mechanism.

The bridge type short circuit conductor 130 is slid from the state shown in FIG. 13 to the right side of FIG. 14A so as to reach the position shown in FIG. 14A. In that position, a contact portion 130R of one end (right end) of the bridge type short circuit conductor 130 is kept connected to one end (right end) portion of the coil conductor, whereas a contact portion 130L of the other end (left end) passes over the other end (left end) of the coil conductor to be positioned in the area of the resistor element 128. Accordingly, the resistance of the variable resistance 122 becomes a significant value other than zero, and the entire coil resistance of the correction coil 70 becomes higher than that of FIG. 13.

When the bridge type short circuit conductor 130 is further slide from the state shown in FIG. 14A to the right side of FIG. 14A, the length of the area of the resistor element 128 on the current path of the correction coil 70 is increased. Accordingly, the resistance of the variable resistor 122 is increased by that amount, and the entire coil resistance of the correction coil 70 becomes higher than that of FIG. 14A.

Figure 14B:
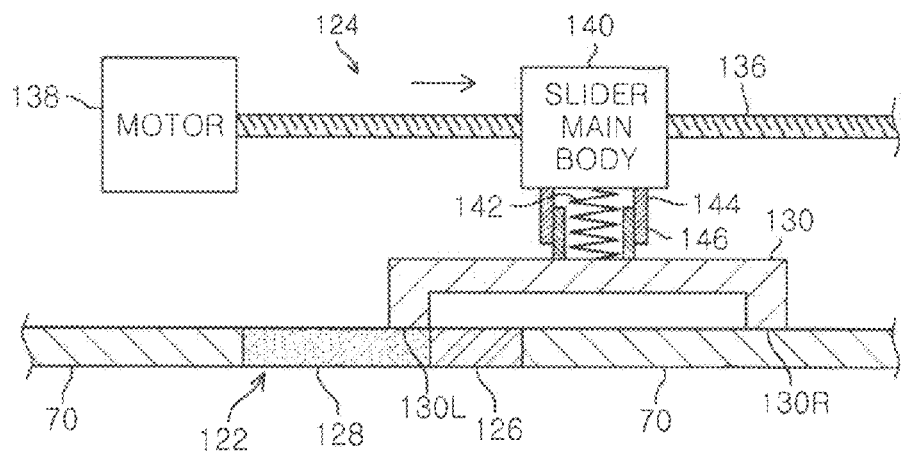
FIG. 14B depicts another position of the resistor in the resistance varying mechanism.

As shown in FIG. 14B, when the left contact portion 130L of the bridge type short circuit conductor 130 is moved to the end of the resistor element 128 on the side of the insulating body 126, the length of the area of the resistor element 128 on the current path of the correction coil 70 becomes maximum. Accordingly, the resistance of the variable resistor 122 becomes maximum, and the entire coil resistance of the correction coil 70 becomes maximum.

Figure 14C:
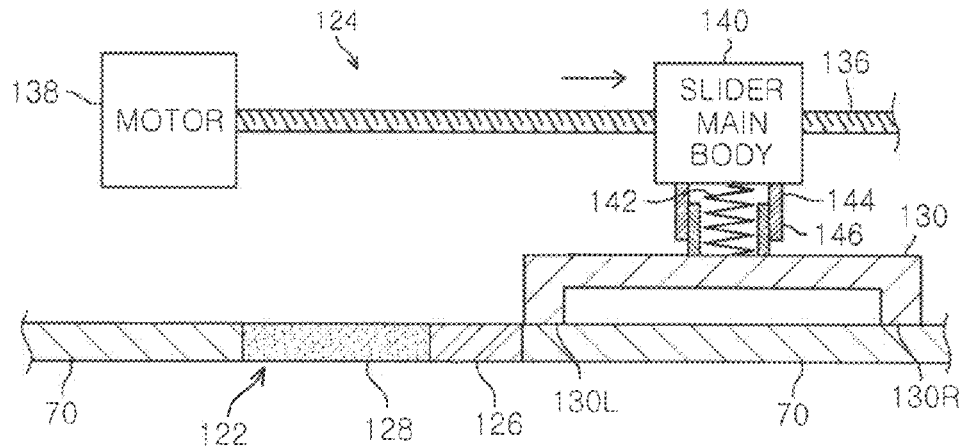
FIG. 14C depicts still another position of the resistor in the resistance varying mechanism.

When the bridge type short circuit conductor 130 is slid from the state shown in FIG. 14B to the right side of FIG. 14B so that the left contact portion 130L of the bridge type short circuit conductor 130 passes over the insulating body 126 to reach the right coil conductor as shown in FIG. 14C, the correction coil 70 is electrically disconnected by the insulating body 126 and has substantially open ends. In a different standpoint, the resistance of the variable resistor 122 becomes infinite.

As described above, in the present embodiment, the resistance of the variable resistor 122 can be variably controlled by the resistance varying mechanism 120, and the entire coil resistance of the correction coil 70 can be continuously varied from a minimum resistance same as the resistance of the coil having both closed ends (see FIG. 13) and a maximum resistance including the entire area of the resistor element 128 (see FIG. 14B). Furthermore, a coil open state (see FIG. 14C) equivalent to the state in which the correction coil 70 is not provided can be selected.

Accordingly, when the current of the RF power $RF_H$ flows in the RF antenna 54, the value (amplitude value or peak value) of the current flowing in the correction coil 70 by the electromagnetic induction can be arbitrarily and variably controlled between 0% and 100%. Here, 100% corresponds to a value of a current flowing in a short-circuited coil (see FIG. 13), and 0% corresponds to a value of a current flowing in the open coil (see FIG. 14C).

Here, it should be noted that the arbitrary adjustment of the value of the current flowing in the correction coil 70 between 0% and 100% by the resistance variable control of the correction coil 70 is functionally equivalent to the arbitrary adjustment of the vertical position of the endless correction coil 70' between the home position $H_P$ close to the upper limit and the lower limit close to the RF antenna 54. In a different standpoint, the characteristics shown in FIG. 5 can be achieved by the inductively coupled plasma etching apparatus employing the resistance varying mechanism 120 while fixing the correction coil 70 at the vertical position close to the RF antenna 54. Further, as in the first embodiment, the degree of freedom and the accuracy in controlling the plasma density distribution can be improved easily.

Therefore, the amplitude value of the current flowing in the correction coil 70 is variably controlled by the resistance varying mechanism 120 whenever the predetermined process parameters of the process recipe are changed, so that it is possible to arbitrarily and accurately control the operation of the correction coil 70 with regard to the RF magnetic field H generated around the antenna conductor by the current of the RF power $RF_H$ which flows in the RF antenna 54, i.e., the degree (strength and weakness) of the effect of locally decreasing the plasma density in the doughnut-shaped plasma around the position overlapped with the coil conductor of the correction coil 70. Accordingly, the uniformity of the radial plasma density around the susceptor 12 can be maintained throughout the entire steps, and the uniformity of the etching process steps of the multilayer resist method can be improved.

For example, although it is not shown, in the etching process steps of the multilayer resist method shown in FIGS. 9A to 9D, at each step of the first step (10 mTorr), the second step (5 mTorr) and the third step (50 mTorr), the resistance (resistance position) of the variable resistor 122 are respectively converted, into a relatively low resistance (resistance position) $R_1$, a lower resistance (resistance position) $R_2$, and a relatively high resistance (resistance position) $R_3$.

In view of the plasma ignitibility, immediately after the process of each step is initiated, the correction coil 70 is maintained in an electrical open state (see FIG. 14C) so that the plasma can be stably ignited and, then, the resistance of the variable resistor 122 is set to a preset value (resistance position) after the plasma ignition.

(Modification)

Figure 15:
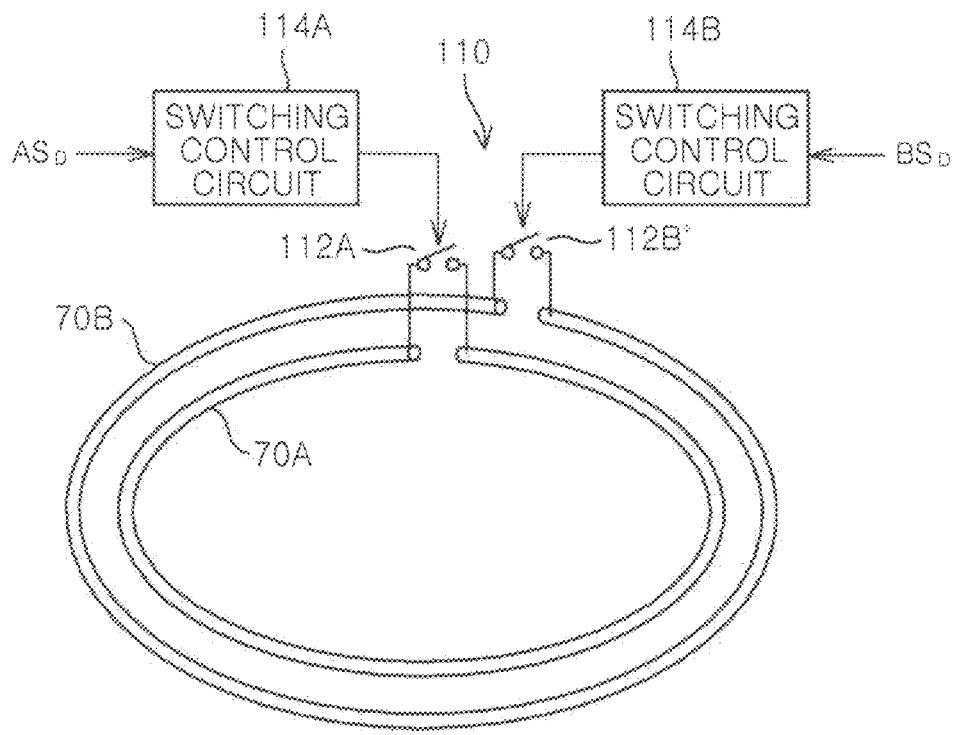
FIG. 15 shows examples of a correction coil and a switching mechanism in accordance with a modification of the first embodiment of the present invention.

FIG. 15 shows a modification of the correction coil 70 and the switching mechanism 110 in accordance with the first embodiment. In the present modification, a plurality of (e.g., two) correction coils 70A and 70B having different diameters are concentrically (coaxially) arranged, and switching devices 112A' and 112B' are provided in the loops of the correction coils 70A and 70B, respectively. Moreover, the switching devices 112A' and 112B' are respectively on-off controlled at an arbitrary duty ratio by respective switching control circuits 114A and 114B using the PWM control.

Figure 16:
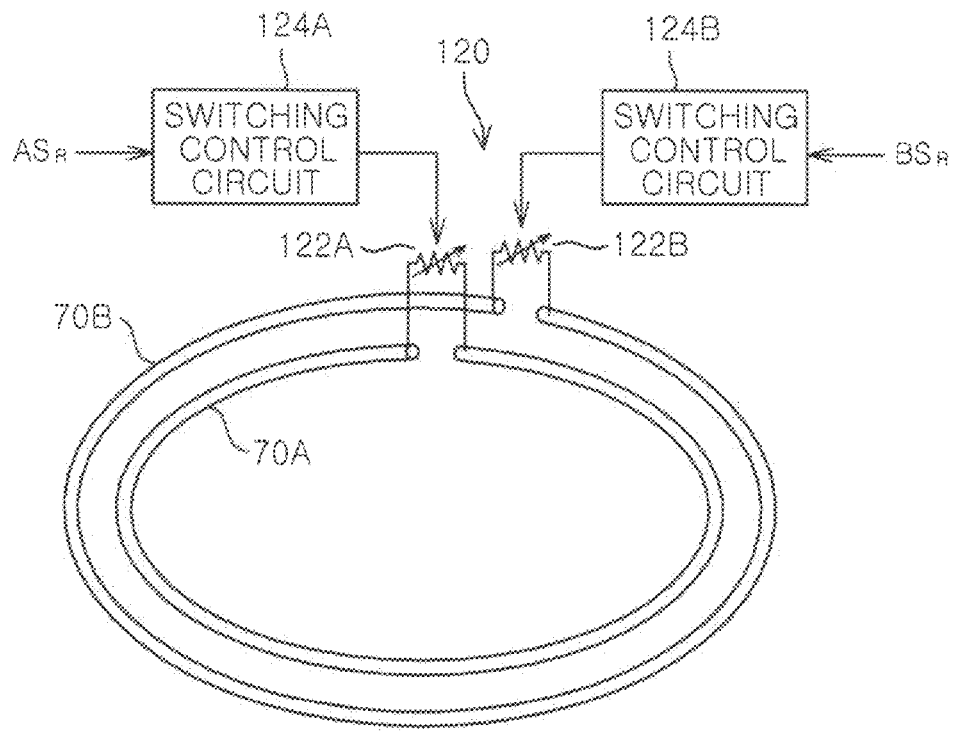
FIG. 16 shows examples of a correction coil and a switching mechanism in accordance with a modification of the second embodiment of the present invention.

FIG. 16 shows a modification of the correction coil 70 and the resistance varying mechanism 120 in accordance with the second embodiment of the present invention. In the present modification, a plurality of (e.g., two) correction coils 70A and 70B having different diameters are concentrically (or coaxially) arranged, and variable resistors 122A and 122B are provided in the loops of the correction coils 70A and 70B, respectively. In addition, the resistances of the variable resistors 122A and 122B are variably and arbitrarily controlled by resistance control units 124A and 124B, respectively.

In the switching device 110 of FIG. 15 and the resistance varying mechanism 120 of FIG. 16, the combination of values (duty ratio or peak value) of the induced currents flowing in the two correction coils 70A and 70B can be variously selected, and the degree of freedom in controlling the plasma density distribution can be further improved.

Figure 17A:
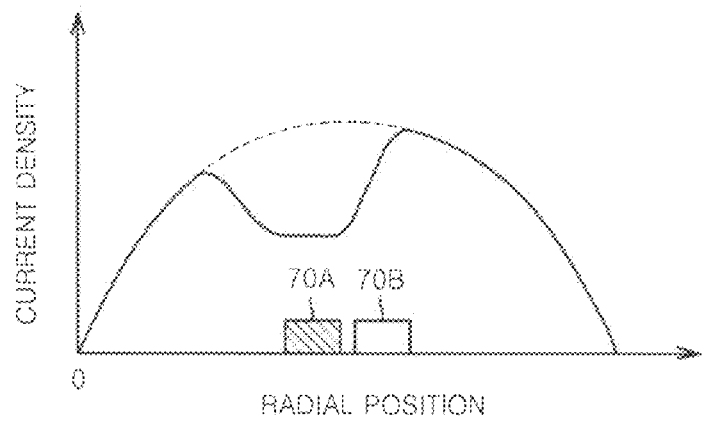
FIG. 17A presents an exemplary operation in the example of FIG. 15 or 16.
Figure 17B:
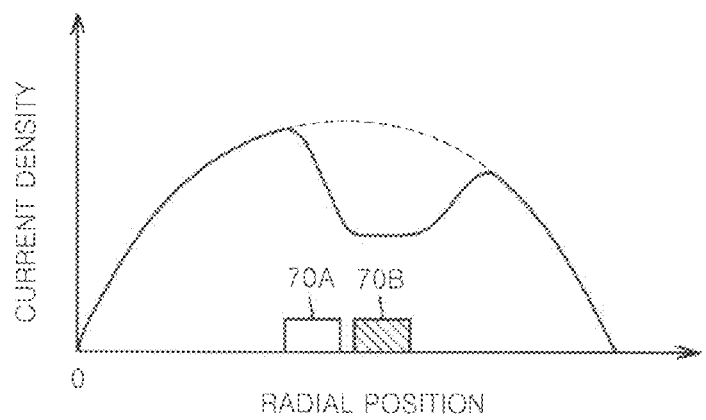
FIG. 17B presents an exemplary operation in the example of FIG. 15 or 16.
Figure 17C:
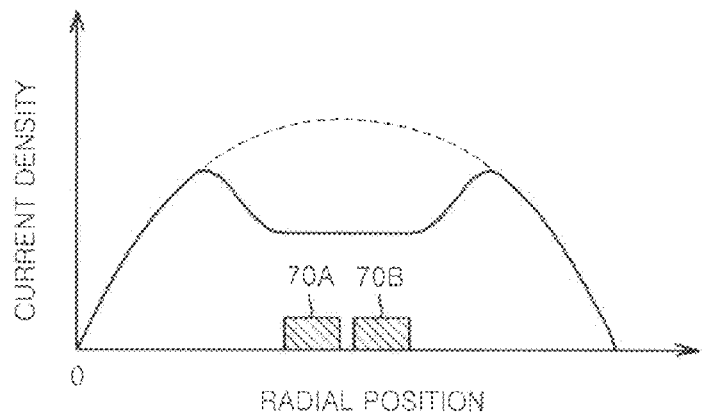
FIG. 17C presents an exemplary operation in the example of FIG. 15 or 16.

As shown in FIG. 17A, only the correction coil 70A can be operated (electrically connected) while maintaining the correction coil 70B in a non-operating (electrically disconnected) state. Or, as shown in FIG. 17B, only the correction coil 70B can be operated (electrically connected) while maintaining the correction coil 70A in a non-operating (electrically disconnected) state. Or, as shown in FIG. 17C, both of the correction coils 70A and 70B can be operated (electrically connected) simultaneously.

Third Embodiment

Figure 18:
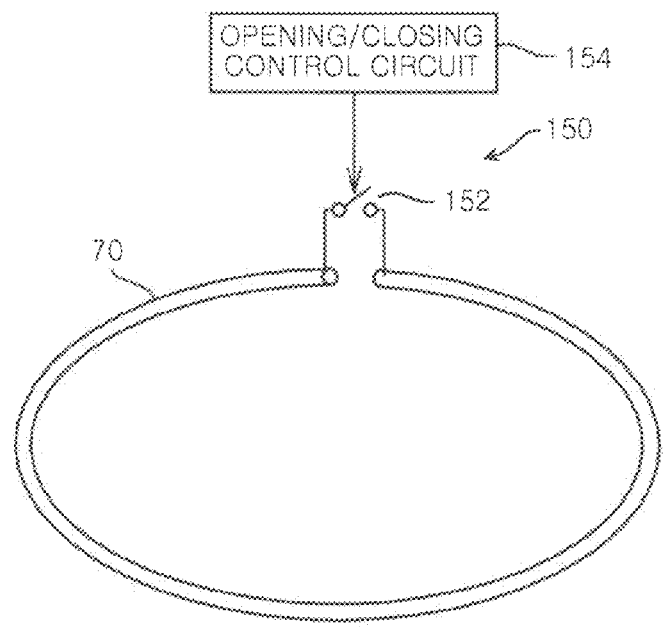
FIG. 18 shows examples of a correction coil and an opening/closing mechanism in accordance with a third embodiment of the present invention.

In a third embodiment, the switching mechanism 110 of the first embodiment can be replaced with an opening/closing mechanism 150 shown in FIG. 18. The opening/closing mechanism 150 includes a switch 152 connected to both open ends of the correction coil 70 via conductors, and an opening/closing control circuit 154 for switching-controlling the opening/closing (on/off) state of the switch 152 based on the instruction from the main control unit 74.

In the opening/closing mechanism 150, when the switch 152 is switched to the open (off) state, the induced current does not flow in the correction coil 70, which is equivalent to the case where the correction coil 70 is not provided. When the switch 152 is switched to the closed (on) state, the correction coil 70 becomes equivalent to a coil having both closed ends, and the induced current flows in the correction coil 70 by allowing the current of the RF power $RF_H$ to flow in the RF antenna 54.

Figure 19:
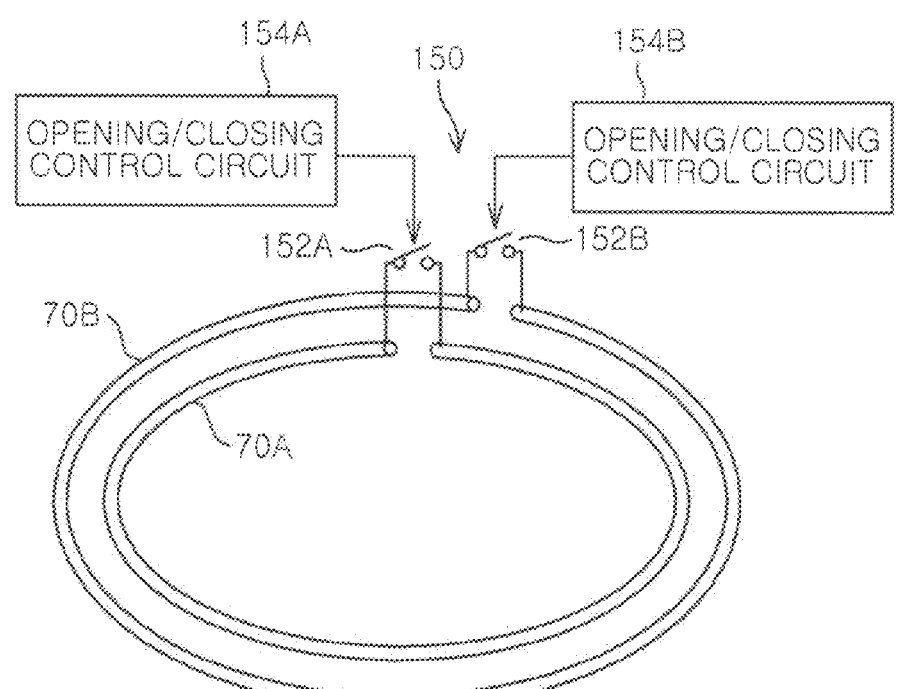
FIG. 19 shows examples of a correction coil and an opening/closing mechanism in accordance with a modification of the third embodiment of the present invention.

As shown in FIG. 19, the opening/closing mechanism 150 can be applied to the configuration in which a plurality of correction coils 70A and 70B are concentrically arranged. Specifically, a plurality of (e.g., two) correction coils 70A and 70B having different diameters are concentrically arranged, and the switches 152A and 152B are provided to be connected to the respective correction coils 70A and 70B. Further, the opening/closing states of the switches 152A and 152B can be independently controlled by the opening/closing control circuits 154A and 154B, respectively. In this type, the distribution of the current density (density of doughnut-shaped plasma) can be variably controlled as shown in FIGS. 17A to 17C although the flexibility of control is limited.

When the opening/closing mechanism 150 is provided, a method for controlling the opening/closing states of the switch 150 (152A and 152B) can be appropriately selected depending on the adjustment, the conversion and the change of the process conditions during a single plasma process or a series of multiple plasma processes of one semiconductor wafer W.

Figure 20:
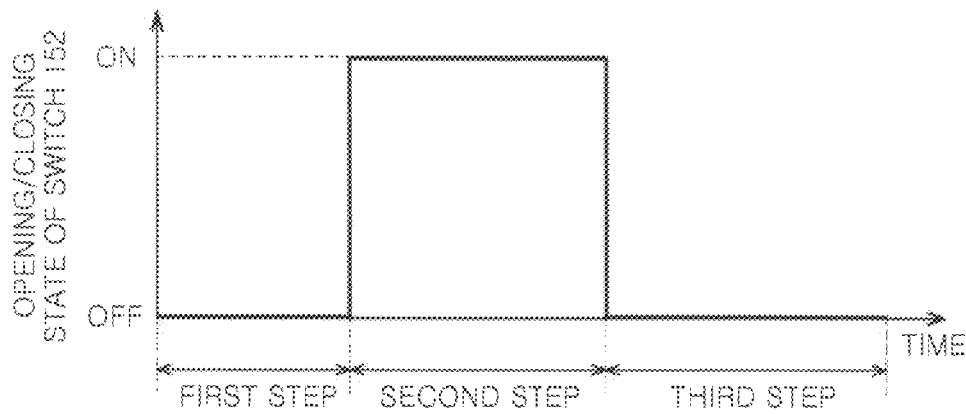
FIG. 20 explains a method for controlling an opening/closing state of a switch provided at a single-type correction coil in the multiple etching process steps of the multilayer resist method.

For example, in the etching process steps (see FIGS. 9A to 9D) of the multilayer resist method, when the single type correction coil 70 (the switch 152) shown in FIG. 18 is used, the switch 152 is converted to the open (off) state in the first step; the switch 152 is converted to the closed (on) state in the second step; and the switch 152 is converted to the open (off) state in the third step, as shown in FIG. 20.

Figure 21:
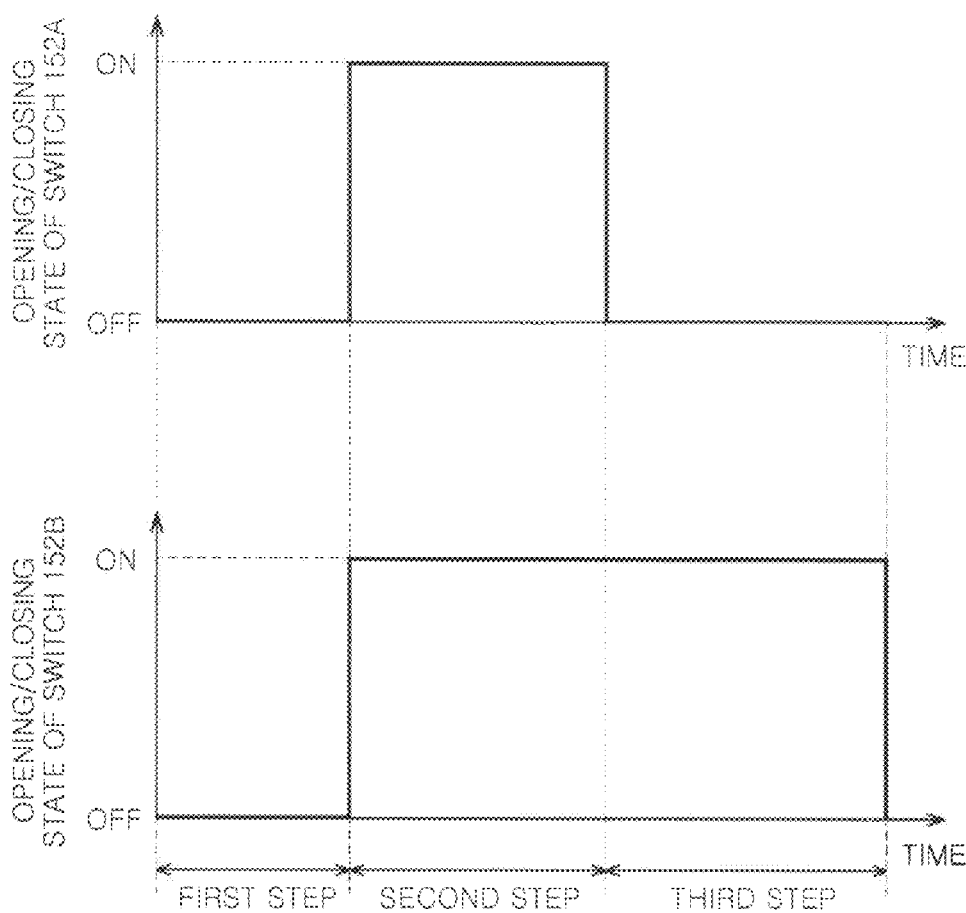
FIG. 21 explains a method for controlling opening/closing states of two switches provided at a twin-type correction coil in multiple etching process steps of the multilayer resist method.

In case of using the twin type correction coils 70A and 70B (switches 152A and 152B) shown in FIG. 19, the switches 152A and 152B are converted to the open (off) state in the first step; the switches 152A and 152B are converted to the closed (on) state in the second step; and the switch 152A is converted to the open (off) state while the switch 152B is kept in the closed (on) state in the third step, as shown in FIG. 21.

Figure 22:
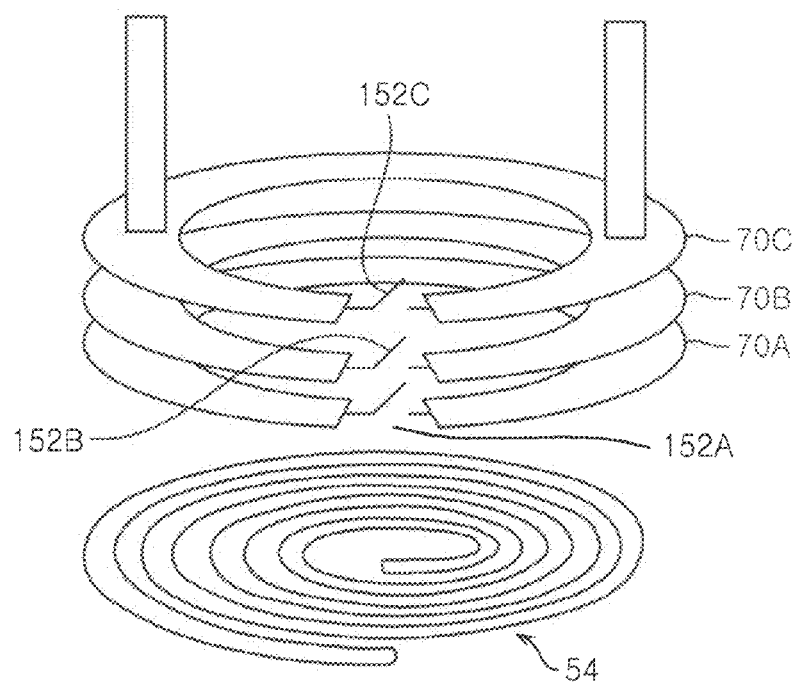
FIG. 22 describes a changeover switch circuit network and a correction coil in accordance with another embodiment of the present invention.

As shown in FIG. 22, the switches 152A, 152B and 152C and the opening/closing control circuits 154A, 154B and 154C (not shown) can also be applied to the configuration in which a plurality of (e.g., three) correction coils 70A, 70B and 70c are coaxially arranged in the vertical direction.

Figure 23:
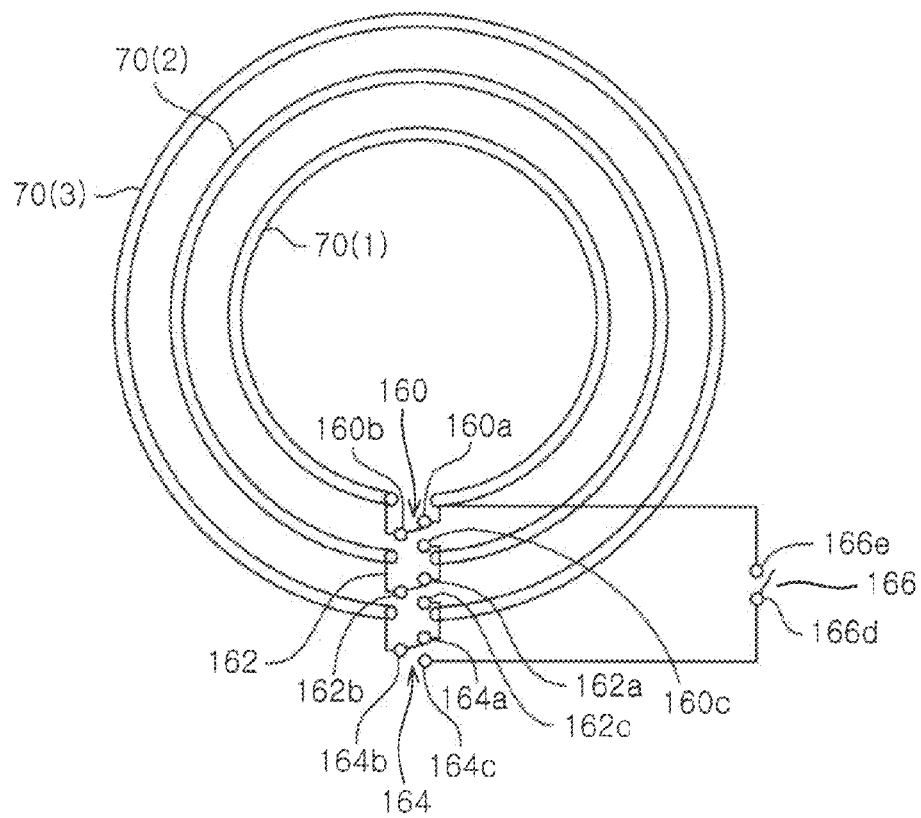
FIG. 23 describes a changeover switch circuit network and a correction coil in accordance with still another embodiment of the present invention.

In the modification of the correction coil 70, as shown in FIG. 23, an independent mode and a connection mode can be selectively switched. The independent mode indicates a state in which a plurality of (e.g., three) coil conductors 70(1), 70(2) and 70(3) function as independent correction coils, and the connection mode indicates a state in which the coil conductors function as a single correction coil electrically connected in series.

Referring to FIG. 23, each of the coil conductors 70(1), 70(2) and 70(3) is formed of a single-wound coil (or a multi-wound coil) having both open ends having a gap therebetween, and the gaps can be electrically connected in various modes via three changeover switches 160, 162 and 164 and a single opening/closing switch 166.

The first changeover switch 160 has a first fixed contact point 160a connected to one end of the inner coil conductor 70(1), a movable contact point 160b connected to the other end of the coil conductor 70(1), and a second fixed contact point 160c connected to one end of the intermediate coil conductor 70(2).

The second changeover switch 162 has a first fixed contact point 162a connected to one end of the intermediate coil conductor 70(2), a movable contact point 162b connected to the other end of the coil conductor 70(2), and a second fixed contact point 162c connected to one end of the outer coil conductor 70(3).

The third changeover switch 164 has a first fixed contact point 164a connected to one end of the outer coil conductor 70(3), a movable contact point 164b connected to the other end of the coil conductor 70(3), and a third fixed contact point 164c connected to a movable contact point 166d of the opening/closing switch 166.

A fixed contact point 166e of the opening/closing switch 166 is connected to one end of the inner coil conductor 70(1).

In such configuration, when the independent mode is selected, the movable contact point 160b of the first changeover switch 160 is connected to the first fixed contact point 160a; the movable contact point 162b of the second changeover switch 162 is connected to the first fixed contact point 162a; the movable contact point 164b of the third changeover switch 164 is connected to the first fixed contact point 164a; and the opening/closing switch 166 is converted to the open state.

When the connection mode is selected, the movable contact point 160b of the first changeover switch 160 is connected to the second fixed contact point 160c; the movable contact point 162b of the second changeover switch 162 is connected to the second fixed contact point 162c; the movable contact point 164b of the third changeover switch 164 is connected to the third fixed contact point 164c; and the opening/closing switch 166 is converted to the closed state.

In a modification of the present embodiment, for example, it is possible to use a switch circuit network in which any two coil conductors among three coil conductors 70(1), 70(2) and 70(3), are set to the connection mode and the other coil conductor is set to the independent mode.

Further, a large induced current (at times, equal to or larger than that flowing in the RF antenna) may flow in the correction coil of the present embodiment, so that the heat generation from the correction coil needs to be controlled.

Figure 24A:
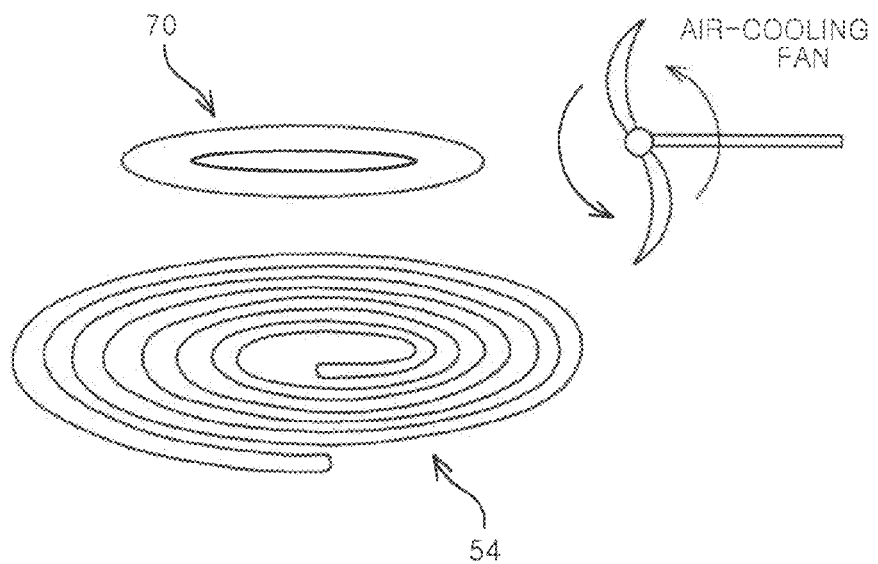
FIG. 24A illustrates a test example in which the correction coil is cooled by air cooling.
Figure 24B:
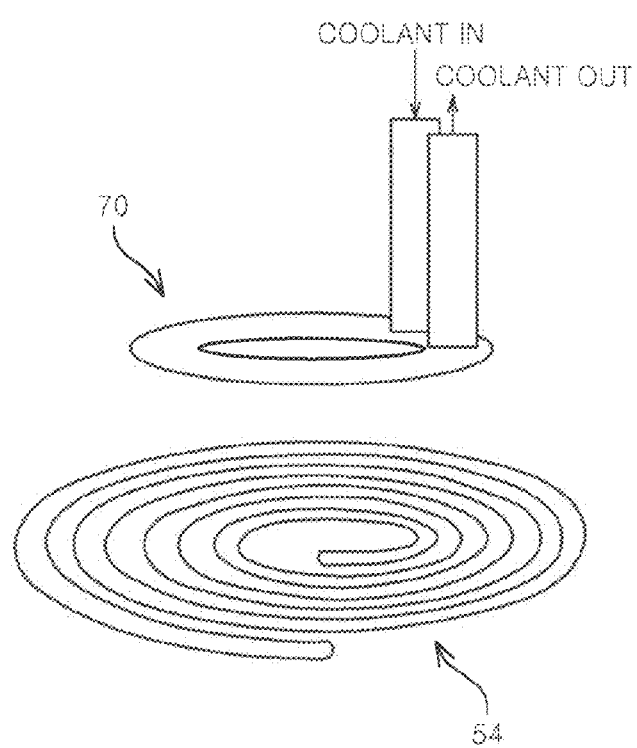
FIG. 24B illustrates a test example in which the correction coil is cooled by a coolant.

In this regard, it is preferable to provide around the correction coil 70 a coil cooling unit for air cooling the correction coil 70 by using a cooling fan installed around the correction coil 70, as shown in FIG. 24A. Alternatively, it is preferable to provide a coil cooling unit for preventing the correction coil 70 from being overheated by supplying a coolant into the correction coil 70 formed of a hollow tube made of copper, as shown in FIG. 24B.

In the aforementioned embodiments of the present invention, the configuration of the inductively coupled plasma etching apparatus is merely an example. Various modifications of the units of the plasma-generation mechanism and units having no direct involvement in the plasma generation may be made.

For example, in the aforementioned embodiments, the correction coil 70 is fixed at one position. However, it is possible to employ a configuration in which the position of the correction coil 70 is varied, especially a configuration in which a vertical position of the correction coil 70 is varied.

In addition, the current path or the loop of the correction coil 70 may be provided with, e.g., a capacitor (not shown), in addition to the switching device 112, the resistor 122 or the switch 152 (152A, 152B and 152C).

For example, the basic shapes of the RF antenna 54 and the correction antenna 70 may be, e.g., a domical shape, instead of the planar shape. Further, the RF antenna 54 and the correction antenna 70 may be installed at a portion other than the ceiling portion of the chamber 10. For example, a helical RF antenna may be installed outside a sidewall of the chamber 10.

Besides, it is possible to provide a chamber structure for a rectangular target substrate to be processed, a rectangular RF antenna structure and a rectangular correction coil structure.

Moreover, a processing gas may be supplied through the ceiling of the chamber 10 from the processing gas supply unit, and no DC bias controlling RF power $RF_L$ may be supplied to the susceptor 12. The present invention can be applied to a plasma processing apparatus in which a plurality of RF antennas or antennasegments are provided; and the plasma-generating RF power is respectively supplied from a plurality of RF power supplies or RF power supply systems to the respective RF antennas (or antennasegments).

In the above embodiments, the inductively coupled plasma processing apparatus or the plasma processing method therefor is not limited to the technical field of the plasma etching, but is applicable to other plasma processes such as a plasma CVD process, a plasma oxidizing process, a plasma nitriding process and the like. In the embodiments, the target substrate to be processed is not limited to the semiconductor wafer. For example, the target substrate may be one of various kinds of substrates, which can be used in a flat panel display (FPD), a photomask, a CD substrate, a print substrate or the like.

In accordance with an inductively coupled plasma processing apparatus and a plasma processing method therefor of the present invention, it is possible to freely accurately control the plasma density distribution by using a correction coil without requiring special processing on the plasma-generating RF antenna or the RF power supply system.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a processing chamber including a dielectric window;
a coil-shaped RF antenna, provided outside the dielectric window;
a substrate supporting unit, provided in the processing chamber, for mounting thereon a target substrate to be processed;
a processing gas supply unit for supplying a desired processing gas to the processing chamber to perform a desired plasma process on the target substrate;
an RF power supply unit for supplying an RF power to the RF antenna to generate a plasma from the processing gas by an inductive coupling in the processing chamber, the RF power having an appropriate frequency for RF discharge of the processing gas;

a correction coil having at least one loop and provided at a position outside the processing chamber, wherein the correction coil is not connected to the RF power supply unit nor to the RF antenna and has two open ends, wherein the correction coil is to be inductively coupled with the RF antenna by electromagnetic induction, the correction coil being configured to use the inductive coupling to locally control a plasma density distribution on the substrate in the processing chamber;

a switch provided in the at least one loop of the correction coil and connected to both of the two open ends of the correction coil; and an opening/closing control circuit configured to control an effect of the correction coil on an RF magnetic field generated around the RF antenna by performing switching control of an opening state and a closing state of the switch.

2. The apparatus of claim 1, wherein the dielectric window forms a ceiling of the processing chamber, wherein the RF antenna is provided on the dielectric window, and wherein the correction coil is provided in parallel with the RF antenna.

3. The apparatus of claim 1, wherein the correction coil is formed from a single-wound or multi-wound coil having opposite open ends, and is arranged to be concentric with the RF antenna, and has a diameter such that a coil conductor of the correction coil is diametrically positioned between an inner periphery and an outer periphery of the RF antenna so that the correction coil is configured to affect the RF magnetic field generated around the RF antenna by an RF current flowing in the RF antenna.

4. The apparatus of claim 1, further comprising a coil cooling unit for cooling the correction coil.

5. The apparatus of claim 1, wherein the opening/closing control circuit is configured to open the switch during a first part of the plasma processing of the target substrate and to close the switch during a second part of the plasma processing of the target substrate.

6. A plasma processing apparatus comprising:

a vacuum-evacuable processing chamber including a dielectric window;

an RF antenna, provided outside the dielectric window;

a substrate supporting unit, provided in the processing chamber, for mounting thereon a target substrate to be processed;

a processing gas supply unit for supplying a desired processing gas to the processing chamber to perform a desired plasma process on the target substrate;

an RF power supply unit for supplying an RF power to the RF antenna to generate a plasma from the processing gas by an inductive coupling in the processing chamber, the RF power having an appropriate frequency for RF discharge of the processing gas;

a first correction coil and a second correction coil each having at least one loop and provided at respective positions outside the processing chamber, wherein each of the first correction coil and the second correction coil is not connected to the RF power supply unit nor to the RF antenna and has two open ends, wherein the first correction coil and the second correction coil are to be inductively coupled with the RF antenna by electromagnetic induction, the first correction coil and the second correction coil being configured to use the inductive coupling to locally control a plasma density distribution on the substrate in the processing chamber;

a first switch and a second switch provided in the at least one loop of the first correction coil and the at least one loop of the second correction coil, respectively, the first switch being connected to both of the two open ends of the first correction coil and the second switch being connected to both of the two open ends of the second correction coil;

a first opening/closing control circuit configured to control an effect of the first correction coil on a first RF magnetic field generated around the RF antenna by performing switching control of an opening state and a closing state of the first switch; and a second opening/closing control circuit configured to control an effect of the second correction coil on a second RF magnetic field generated around the RF antenna by performing switching control of an opening state and a closing state of the second switch.

7. The apparatus of claim 6, wherein the dielectric window forms a ceiling of the processing chamber, wherein the RF antenna is provided on the dielectric window, and wherein the first correction coil and the second correction coil are arranged to be parallel with the RF antenna.

8. The apparatus of claim 7, wherein the first correction coil and the second correction coil are concentrically arranged.

9. The apparatus of claim 6, further comprising a coil cooling unit for cooling the first correction coil and the second correction coil.

10. The apparatus of claim 6, wherein the first correction coil and the second correction coil are not connected.

11. The apparatus of claim 6, wherein the first opening/closing control circuit is configured to open the first switch during a first part of the plasma processing of the target substrate and to close the first switch during a second part of the plasma processing of the target substrate, and wherein the second opening/closing control circuit is configured to open the second switch during the first part of the plasma processing of the target substrate and to close the second switch during the second part of the plasma processing of the target substrate.

* * * * *